(12) United States Patent
Kim

(10) Patent No.: US 9,595,326 B2
(45) Date of Patent: *Mar. 14, 2017

(54) ELECTRONIC DEVICE

(71) Applicant: SK hynix Inc., Icheon-Si (KR)

(72) Inventor: Dong-Keun Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/144,703

(22) Filed: May 2, 2016

(65) Prior Publication Data

US 2016/0247566 A1    Aug. 25, 2016

Related U.S. Application Data

(63) Continuation of application No. 14/190,086, filed on Feb. 25, 2014, now Pat. No. 9,330,757.

(30) Foreign Application Priority Data

Feb. 28, 2013   (KR) .......................... 10-2013-0022213

(51) Int. Cl.
  *G11C 7/06*        (2006.01)
  *G11C 13/00*       (2006.01)
  (Continued)

(52) U.S. Cl.
  CPC ...... *G11C 13/0069* (2013.01); *G06F 12/0802* (2013.01); *G06F 13/4068* (2013.01); *G11C 11/1673* (2013.01); *G11C 13/004* (2013.01); *G11C 13/0026* (2013.01); *G11C 13/0064* (2013.01); *G06F 2212/60* (2013.01);
  (Continued)

(58) Field of Classification Search
  CPC .. H01L 45/06; H01L 27/1157; H01L 27/1116; H01L 27/11521; H01L 27/11573; H01L 27/2427; H01L 23/528; H01L 27/11548; G11C 11/419; G11C 13/004; G11C 2213/79; G11C 16/06; G11C 7/12; G11C 8/08; G11C 11/4085; G11C 11/5642; G11C 13/0026; G11C 13/003; G11C 11/4094; G11C 2013/009; G11C 2029/1202
  USPC ....... 365/46, 55, 74, 97, 100, 131, 148, 158, 365/171, 173, 163, 185.11, 63, 189.011, 365/189.141, 89.18, 210.1, 189.07
  See application file for complete search history.

(56) References Cited

U.S. PATENT DOCUMENTS 8,145,467 B1    3/2012  Ou et al.
8,897,061 B2 *  11/2014 Ezaki .................... G11C 11/161
                                                           365/157

(Continued)

*Primary Examiner* — Fernando Hidalgo
(74) *Attorney, Agent, or Firm* — Perkins Coie LLP

(57) ABSTRACT

An electronic device comprising a semiconductor memory unit that may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line.

20 Claims, 11 Drawing Sheets

(51) Int. Cl.
  *G11C 11/16* (2006.01)
  *G06F 12/08* (2016.01)
  *G06F 13/40* (2006.01)

(52) U.S. Cl.
  CPC ............... *G11C 2013/0052* (2013.01); *G11C 2013/0054* (2013.01); *G11C 2013/0066* (2013.01); *G11C 2013/0092* (2013.01); *G11C 2213/79* (2013.01); *G11C 2213/82* (2013.01)

(56) References Cited

U.S. PATENT DOCUMENTS

| | | | |
|---|---|---|---|
| 8,913,416 B2 * | 12/2014 | Kitagawa | G11C 13/0007 365/148 |
| 2009/0257268 A1 | 10/2009 | Kajigaya | |
| 2012/0134210 A1 | 5/2012 | Maeda | |
| 2012/0257449 A1 | 10/2012 | Agan et al. | |

* cited by examiner

ELECTRONIC DEVICE

CROSS-REFERENCE TO RELATED APPLICATIONS

This present application is a continuation of, and claims priority and benefits of, U.S. patent application Ser. No. 14/190,086, published as US 2014/0244931, entitled "ELECTRONIC DEVICE," and filed on Feb. 25, 2014, which further claims priority of Korean Patent Application No. 10-2013-0022213, entitled "SEMICONDUCTOR DEVICE, PROCESSOR AND SYSTEM," and filed on Feb. 28, 2013. The contents of the before-mentioned patent applications (including US 2014/0244931) are incorporated herein by reference in their entirety as part of the disclosure of this document.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the path of current flowing through a storage cell becomes constant regardless of a position of the storage cell when reading data from the storage cell or writing data in the storage cell, thereby reducing an influence exerted on a read or write operation of a semiconductor device by parasitic components included in the semiconductor device.

In an implementation, there is provided an electronic device including a semiconductor memory unit. The electronic device comprising a semiconductor memory unit that may include: a cell array including a plurality of storage cells; a first line connected to one ends of the plurality of storage cells; a second line connected to the other ends of the plurality of storage cells; a first driver connected to one end of the first line corresponding to one side direction of the cell array, and configured to apply a source voltage or a sink voltage to the one end of the first line; and a second driver connected to one end of the second line corresponding to the other side direction of the cell array, and configured to apply the source voltage or the sink voltage to the one end of the second line.

In the case where the first driver applies the source voltage to the one end of the first line and the second driver applies the sink voltage to the one end of the second line, current flows from the one end of the first line to the one end of the second line through a storage cell selected among the plurality of storage cells.

In the case where the first driver applies the sink voltage to the one end of the first line and the second driver applies the source voltage to the one end of the second line, current flows from the one end of the second line to the one end of the first line through a storage cell selected among the plurality of storage cells.

The semiconductor memory unit further include: a reference cell with a reference resistance value; and a comparator having a first input terminal which is connected to one of the first line and the second line and a second input terminal which is connected to the reference cell, and configured to output a result of comparing a resistance value of a storage cell selected among the plurality of storage cells and the reference resistance value, in a read operation, wherein each of the plurality of storage cells is changed in its resistance value according to a value of data stored therein.

Each of the plurality of storage cells has a first resistance value in the case where first data is stored therein and has a second resistance value higher than the first resistance value in the case where second data different from the first data is stored therein, and the reference resistance value is larger than the first resistance value and is smaller than the second resistance value.

In the read operation, the first driver applies one of the source voltage and the sink voltage to the one end of the first line, and the second driver applies a voltage not applied to the one end of the first line, among the source voltage and the sink voltage, to the one end of the second line.

In a write operation, the first driver applies one of the source voltage and the sink voltage, according to a value of data to be written in the selected storage cell, to the one end of the first line, and the second driver applies a voltage not applied to the one end of the first line, among the source voltage and the sink voltage, to the one end of the second line.

The resistance variable element included in each of the plurality of storage cells includes a metal oxide, a phase change substrate, and a structure in which a tunneling barrier layer is interposed between two ferromagnetic layers.

The electronic device comprising a semiconductor memory unit that may include: a first to Nth cell arrays each including a plurality of storage cells, a first line which is connected to one ends of the plurality of storage cells, and a second line which is connected to the other ends of the plurality of storage cells; a first global line electrically connected with one end of the first line of a cell array selected among the first to Nth cell arrays; a second global line electrically connected with one end of the second line of the selected cell array; a first driver connected to one end of the first global line corresponding to one side direction of the first cell array, and configured to apply a source voltage or a sink voltage to the one end of the first global line; and a second driver connected to one end of the second global line corresponding to the other side direction of the Nth cell array, and configured to apply the source voltage or the sink voltage to the one end of the second global line.

In the case where the first driver applies the source voltage to the one end of the first global line and the second driver applies the sink voltage to the one end of the second global line, current flows from one end of the first global line to the one end of the second global line through a storage cell selected among the plurality of storage cells of a cell array selected among the first to Nth cell arrays.

In the case where the first driver applies the sink voltage to the one end of the first global line and the second driver applies the source voltage to the one end of the second global line, current flows from one end of the second global line to the one end of the first global line through a storage cell selected among the plurality of storage cells of a cell array selected among the first to Nth cell arrays.

One end of the first line of a Kth ($1 \leq K \leq N$) cell array among the first to Nth cell arrays is the one side direction of the Kth cell array, and one end of the second line of the Kth cell array is the other side direction of the Kth cell array.

The semiconductor memory unit further include: first to Nth one side switches connected between one ends of first lines of the first to Nth cell arrays and the first global line, and configured to be turned on when cell arrays connected to them are selected among the first to Nth cell arrays; and first to Nth other side switches connected between one ends of second lines of the first to Nth cell arrays and the second global line, and configured to be turned on when cell arrays connected to them are selected among the first to Nth cell arrays.

The semiconductor memory unit further include: further comprising: a reference cell with a reference resistance value; and a comparator having a first input terminal which is connected to one of the first global line and the second global line and a second input terminal which is connected to the reference cell, and configured to output a result of comparing a resistance value of a storage cell selected among the plurality of storage cells of a cell array selected among the first to Nth cell arrays and the reference resistance value, in a read operation, wherein each of the plurality of storage cells of each of the first to Nth cell arrays is changed in its resistance value according to a value of data stored therein.

Each of the plurality of storage cells of each of the first to Nth cell arrays has a first resistance value in the case where first data is stored therein and has a second resistance value higher than the first resistance value in the case where second data different from the first data is stored therein, and the reference resistance value is larger than the first resistance value and is smaller than the second resistance value.

In the read operation, the first driver applies one of the source voltage and the sink voltage to the one end of the first global line, and the second driver applies a voltage not applied to the one end of the first global line, among the source voltage and the sink voltage, to the one end of the second global line.

In a write operation, the first driver applies one of the source voltage and the sink voltage, according to a value of data to be written in the selected storage cell, to the one end of the first global line, and the second driver applies a voltage not applied to the one end of the first global line, among the source voltage and the sink voltage, to the one end of the second global line.

The resistance variable element included in each of the plurality of storage cells includes a metal oxide, a phase change substrate, and a structure in which a tunneling barrier layer is interposed between two ferromagnetic layers.

The electronic device comprising a semiconductor memory unit that may include: a cell array including a plurality of storage cells; a first line connected to one ends of the plurality of storage cells; and a second line connected to the other ends of the plurality of storage cells, wherein, in a read/write operation, current flows between one end of the first line corresponding to one side direction of the cell array and one end of the second line corresponding to the other side direction of the cell array.

In the read/write operation, current which flows between the one end of the first line and the one end of the second line flows through a storage cell selected among the plurality of storage cells.

In the read operation, one voltage of a source voltage and a sink voltage is applied to the one end of the first line, and a voltage not applied to the one end of the first line, among the source voltage and the sink voltage, is applied to the one end of the second line.

In the write operation, one voltage of the source voltage and the sink voltage is applied to the one end of the first line according to a value of data to be written in a storage cell selected among the plurality of storage cells, and a voltage not applied to the one end of the first line, among the source voltage and the sink voltage, is applied to the one end of the second line.

The resistance variable element included in each of the plurality of storage cells includes a metal oxide, a phase change substrate, and a structure in which a tunneling barrier layer is interposed between two ferromagnetic layers.

The electronic device comprising a semiconductor memory unit that may include: a first to Nth cell arrays each including a plurality of storage cells, a first line which is connected to one ends of the plurality of storage cells, and a second line which is connected to the other ends of the plurality of storage cells; a first global line electrically connected with one end of the first line of a cell array selected among the first to Nth cell arrays; and a second global line electrically connected with one end of the second line of the selected cell array, wherein, in a read/write operation, current flows between one end of the first global line corresponding to one side direction of the first cell array and one end of the second global line corresponding to the other side direction of the Nth cell array.

In the read/write operation, current which flows between the one end of the first global line and the one end of the second global line flows through a storage cell selected among the plurality of storage cells of a cell array selected among the first to Nth cell arrays.

One end of the first line of a Kth ($1 \leq K \leq N$) cell array among the first to Nth cell arrays is the one side direction of the Kth cell array, and one end of the second line of the Kth cell array is the other side direction of the Kth cell array.

In the read/write operation, current which flows between the one end of the first global line and the one end of the second global line flows between the one end of the first line and the one end of the second line of a cell array selected among the first to Nth cell arrays.

The semiconductor memory unit further include: first to Nth one side switches connected between one ends of first lines of the first to Nth cell arrays and the first global line, and configured to be turned on when cell arrays connected to them are selected among the first to Nth cell arrays; and first to Nth other side switches connected between one ends of second lines of the first to Nth cell arrays and the second global line, and configured to be turned on when cell arrays connected to them are selected among the first to Nth cell arrays.

In the read operation, one voltage of a source voltage and a sink voltage is applied to the one end of the first global line, and a voltage not applied to the one end of the first global line, among the source voltage and the sink voltage, is applied to the one end of the second global line.

In the write operation, one voltage of the source voltage and the sink voltage is applied to the one end of the first global line according to a value of data to be written in a storage cell selected among the plurality of storage cells, and a voltage not applied to the one end of the first global line, among the source voltage and the sink voltage, is applied to the one end of the second global line.

A microprocessor comprises a control unit configured to receive a signal including a command from an outside, and control extraction, decoding, input and output of the command; an operation unit configured to perform an operation according to a result that the control unit decodes the command; and a memory unit configured to store at least one of data for performing the operation, data corresponding to a result of performing the operation, and an address of data for which the operation is performed, the memory unit comprising: a cell array including a plurality of storage cells; a first line connected to one ends of the plurality of storage cells; a second line connected to the other ends of the plurality of storage cells; a first driver connected to one end of the first line corresponding to one side direction of the cell array, and configured to apply a source voltage or a sink voltage to the one end of the first line; and a second driver connected to one end of the second line corresponding to the other side direction of the cell array, and configured to apply the source voltage or the sink voltage to the one end of the second line.

A processor comprises a core block configured to perform, according to a command inputted from an outside, an operation corresponding to the command, by using data; a cache memory unit configured to store at least one of data for performing the operation, data corresponding to a result of performing the operation, and an address of data for which the operation is performed; and a bus interface connected between the core block and the cache memory unit, and configured to transmit data between the core block and the cache memory unit, the cache memory unit comprising: a cell array including a plurality of storage cells; a first line connected to one ends of the plurality of storage cells; a second line connected to the other ends of the plurality of storage cells; a first driver connected to one end of the first line corresponding to one side direction of the cell array, and configured to apply a source voltage or a sink voltage to the one end of the first line; and a second driver connected to one end of the second line corresponding to the other side direction of the cell array, and configured to apply the source voltage or the sink voltage to the one end of the second line.

A system comprises a processor configured to decode a command inputted from an outside and control an operation for information according to a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, at least one of the auxiliary memory device and the main memory device comprising: a cell array including a plurality of storage cells; a first line connected to one ends of the plurality of storage cells; a second line connected to the other ends of the plurality of storage cells; a first driver connected to one end of the first line corresponding to one side direction of the cell array, and configured to apply a source voltage or a sink voltage to the one end of the first line; and a second driver connected to one end of the second line corresponding to the other side direction of the cell array, and configured to apply the source voltage or the sink voltage to the one end of the second line.

A data storage system comprises a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, at least one of the storage device and the temporary storage device comprising: a cell array including a plurality of storage cells; a first line connected to one ends of the plurality of storage cells; a second line connected to the other ends of the plurality of storage cells; a first driver connected to one end of the first line corresponding to one side direction of the cell array, and configured to apply a source voltage or a sink voltage to the one end of the first line; and a second driver connected to one end of the second line corresponding to the other side direction of the cell array, and configured to apply the source voltage or the sink voltage to the one end of the second line.

A memory system comprises a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, at least one of the memory and the buffer memory comprising: a cell array including a plurality of storage cells; a first line connected to one ends of the plurality of storage cells; a second line connected to the other ends of the plurality of storage cells; a first driver connected to one end of the first line corresponding to one side direction of the cell array, and configured to apply a source voltage or a sink voltage to the one end of the first line; and a second driver connected to one end of the second line corresponding to the other side direction of the cell array, and configured to apply the source voltage or the sink voltage to the one end of the second line.

An electronic device comprising a semiconductor memory unit may include: a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line to cause a current to flow through the cell array between the first and second lines, wherein the first contact location on the first line and the second contact location on the second line are selected to cause current path lengths of different storage cells inside the cell array between the first and second contact points to be substantially the same for different storage cells.

The first and second electrical signals are voltage signals.

In the read operation, the first driver applies the first electrical signal to the one end of the first line, and the second driver applies the second electrical signal to the one end of the second line without being applied the one end of the first line.

In a write operation, the first driver applies the first electrical signal, according to a value of data to be written in the selected storage cell, to the one end of the first line, and the second driver applies the second electrical signal to the one end of the second line without being applied to the one end of the first line.

An electronic device comprising a semiconductor memory unit may include: a first to Nth cell arrays each including a plurality of storage cells, a first line which is connected to one ends of the plurality of storage cells, and a second line which is connected to the other ends of the plurality of storage cells; a first global line electrically connected with one end of the first line of a cell array selected among the first to Nth cell arrays; a second global line electrically connected with one end of the second line of the selected cell array; a first driver connected to one end of the first global line at a first contact location on a first side of the first cell array and other cell arrays of the first to the Nth cell arrays, and configured to apply a first electrical signal to the one end of the first global line; and a second driver connected to one end of the second global line at a second contact location on a second side of the Nth cell array and other cell arrays of the first to the Nth cell arrays, and configured to apply a second electrical signal to the one end of the second global line to cause a current to flow through a selected storage cell between the first and second global lines, wherein the first contact location on the first global line and the second contact location on the second global line are selected to cause current path lengths of different storage cells in the first to the Nth cell arrays between the first and second contact points to be substantially the same for different storage cells.

The storage cell is selected among the plurality of storage cells of a cell array selected among the first to Nth cell arrays.

In the read operation, the first driver applies the first electrical signal to the one end of the first global line, and the second driver applies the second electrical signal to the one end of the second global line without being applied to the one end of the first global line.

In a write operation, the first driver applies the first electrical signal, according to a value of data to be written in the selected storage cell, to the one end of the first global line, and the second driver applies the second electrical signal to the one end of the second global line without being applied to the one end of the first global line.

An electronic device comprising a semiconductor memory unit may include: a cell array including a plurality of storage cells; a first line connected to one ends of the plurality of storage cells; and a second line connected to the other ends of the plurality of storage cells, wherein the first and second lines are electrically coupled to, in a read/write operation, cause a current to flow between one end of the first line corresponding to one side direction of the cell array and one end of the second line corresponding to the other side direction of the cell array.

In the read operation, the first electrical signal is a first voltage applied to the one end of the first line, and the second electrical signal is a second voltage applied to the one end of the second line without being applied the one end of the first line.

In the write operation, the first electrical signal is a first voltage applied to the one end of the first line according to a value of data to be written in a storage cell selected among the plurality of storage cells, and the second electrical signal is a second voltage applied to the one end of the second line without being applied to the one end of the first line.

An electronic device comprising a semiconductor memory unit may include: a first to Nth cell arrays each including a plurality of storage cells, a first line which is connected to one ends of the plurality of storage cells, and a second line which is connected to the other ends of the plurality of storage cells; a first global line electrically connected with one end of the first line of a cell array selected among the first to Nth cell arrays; and a second global line electrically connected with one end of the second line of the selected cell array, wherein, the first and second global lines are configured to, in a read/write operation, cause a current to flow between one end of the first global line corresponding to one side direction of the first cell array and one end of the second global line corresponding to the other side direction of the Nth cell array.

In the write operation, a first electrical signal is applied to the one end of the first global line according to a value of data to be written in a storage cell selected among the plurality of storage cells, and a second electrical signal is applied to the one end of the second global line without being applied to the one end of the first global line.

An electronic device comprising a semiconductor memory unit may include: an array of memory cells each having a resistance variable element exhibiting two different resistance values in response to two different currents flowing there through in opposite directions, respectively, and a cell select transistor responsive to a cell select control signal to activate the memory cell; a first line coupled to a first side of the memory cells; a first driver circuit coupled to the first line to supply a first electrical control signal; a second line coupled to a second side of the memory cells; and a second driver circuit coupled to the second line to supply a second electrical control signal; and a memory control circuit coupled to the array of memory cells to apply to apply a cell select control signal to activate a select memory cell, wherein a coupling between the first driver circuit and the first line and a coupling between the second driver circuit and the second line are configured to cause current path lengths for currents flowing through different select memory cells of the array of the memory cells between the first and second drivers to be a constant.

The memory control circuit includes a comparator that is coupled to the first line and a reference cell that is coupled to the comparator, wherein the comparator compares currents from the first line and the reference cell to generate an output indicating a memory value of the select memory cell.

An electronic device comprising a semiconductor memory unit may include: a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line.

The first and second electrical signals are voltage signals, a direction of a current which flows through the one end of the first line, a selected storage cell and the one end of the second line, is determined according to each level of the first and second electrical signals.

In the read operation, the first driver applies the first electrical signal to the one end of the first line, and the second driver applies the second electrical signal to the one end of the second line, wherein levels of the first and second electrical are different. In a write operation, the first driver applies the first electrical signal to the one end of the first line, and the second driver applies the second electrical signal to the one end of the second line, wherein levels of the first and second electrical are determined according to a value of data to be written in the selected storage cell, and levels of the first and second electrical are different.

An electronic device comprising a semiconductor memory unit may include: a first to Nth cell arrays each including a plurality of storage cells, a first line which is connected to one ends of the plurality of storage cells, and a second line which is connected to the other ends of the plurality of storage cells; a first global line electrically connected with one end of the first line of a cell array selected among the first to Nth cell arrays; a second global line electrically connected with one end of the second line of the selected cell array; a first driver connected to one end of the first global line at a first contact location on a first side of the first cell array and other cell arrays of the first to the Nth cell arrays, and configured to apply a first electrical signal to the one end of the first global line; and a second driver connected to one end of the second global line at a second contact location on a second side of the Nth cell array and other cell arrays of the first to the Nth cell arrays, and configured to apply a second electrical signal to the one end of the second global line to cause a current to flow through a selected storage cell between the first and second global lines.

The first and second electrical signals are voltage signals, a direction of a current which flows through the one end of the first global line, a selected storage cell and the one end of the second global line, is determined according to each level of the first and second electrical signals.

In the read operation, the first driver applies the first electrical signal to the one end of the first global line, and the second driver applies the second electrical signal to the one end of the second global line, wherein levels of the first and second electrical are different.

In a write operation, the first driver applies the first electrical signal to the one end of the first global line, and the second driver applies the second electrical signal to the one end of the second global line, wherein levels of the first and second electrical are determined according to a value of data to be written in the selected storage cell, and levels of the first and second electrical are different.

The variable resistance element may include at least one among a metal oxide, a phase change substance and a structure in which a tunnel barrier layer is interposed between two ferromagnetic layers.

The electronic device further comprising a microprocessor which may include: a control unit that is configured to receive a signal including a command from an outside of the microprocessor, and performs extracting, decoding of the command, or controlling input or output of a signal of microprocessor; and an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the variable resistance element is part of the memory unit in the microprocessor.

The electronic device further comprising a processor which may include: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the variable resistance element is part of the cache memory unit in the processor.

The electronic device further comprising a processing system which may include: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between the processor, the auxiliary memory device or the main memory device and the outside, wherein the semiconductor memory unit that includes the variable resistance element is part of the auxiliary memory device or the main memory device in the processing system.

The electronic device further comprising a data storage system which may include: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the variable resistance element is part of the storage device or the temporary storage device in the data storage system.

The electronic device further comprising a memory system which may include: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the variable resistance element is part of the memory or the buffer memory in the memory system.

BRIEF DESCRIPTION OF THE DRAWINGS

Various examples and implementations of the disclosed technology are described below in detail with reference to the accompanying drawings.

DETAILED DESCRIPTION

Various examples and implementations of the disclosed technology are described below in detail with reference to the accompanying drawings.

A semiconductor device in accordance with the present implementations may include a variable resistor. The variable resistor may exhibit a variable resistance characteristic, and include a single layer or multilayer. For example, the variable resistor may include a material used in RRAM, PRAM, MRAM, FRAM and the like, such as a chalcogenide-based compound, a transition metal compound, a ferroelectric material, or a ferromagnetic material. However, the present implementations are not limited thereto, as long as the variable resistor has a variable resistance characteristic of switching between different resistance states depending on a voltage or current applied across the variable resistor.

More specifically, the variable resistor may include metal oxide. The metal oxide may include a transition metal oxide such as nickel oxide, titanium oxide, hafnium oxide, zirconium oxide, tungsten oxide, or cobalt oxide and a perovskite-based material such as STO (SrTiO) or PCMO (PrCaMnO). Such a variable resistor may exhibit a characteristic of switching between different resistance states through formation/disappearance of a current filament caused by behavior of vacancies.

Furthermore, the variable resistor may include a phase change material. The phase change material may include a chalcogenide-based material such as GST (Ge—Sb—Te), for example. The variable resistor is stabilized to any one of a crystalline state and an amorphous state by heat, thereby switching between different resistance states.

Furthermore, the variable resistor may include a structure having a tunnel barrier layer interposed between two magnetic layers. The magnetic layer may be formed of NiFeCo or CoFe, and the tunnel barrier layer may be formed of $Al_2O_3$. The variable resistor may exhibit a characteristic of switching between different resistance states according to the magnetization direction of the magnetic layer. For example, the variable resistor may have a low-resistance state when the magnetization directions of the two magnetic layers are parallel to each other, and may have a high-resistance state when the magnetization directions of the two magnetic layers are anti-parallel to each other.

Figure 1:
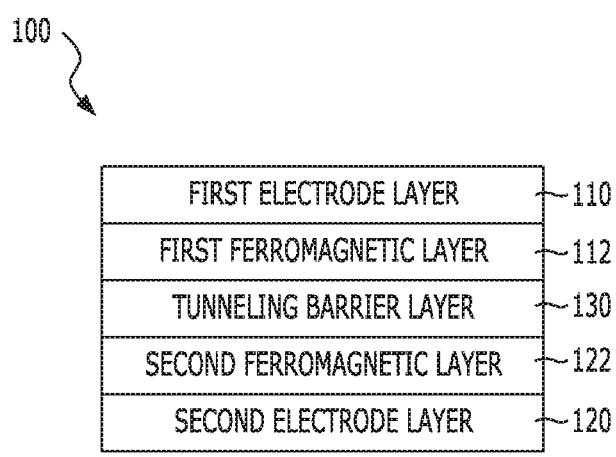
FIG. 1 is a diagram illustrating an implementation of a magnetic tunnel junction (MTJ) which is one of a structure having a tunnel barrier layer interposed between two magnetic layers.

FIG. 1 is a diagram illustrating an implementation of a magnetic tunnel junction (MTJ) which is one of a structure having a tunnel barrier layer interposed between two magnetic layers.

As illustrated in FIG. 1, the MTJ 100 includes a first electrode layer 110 serving as a top electrode, a second electrode layer 120 serving as a bottom electrode, a pair of first and second magnetic layers 112 and 122, and a tunnel barrier layer 130 formed between the pair of magnetic layers 112 and 122.

The first magnetic layer 112 may include a free ferromagnetic layer of which the magnetization direction is varied according to the direction of a current applied to the MTJ 100, and the second magnetic layer 122 may include a pinned ferromagnetic layer of which the magnetization direction is pinned.

The MTJ 100 of which the resistance value is changed according to the direction of the current records data "0" or "1".

Figure 2A:
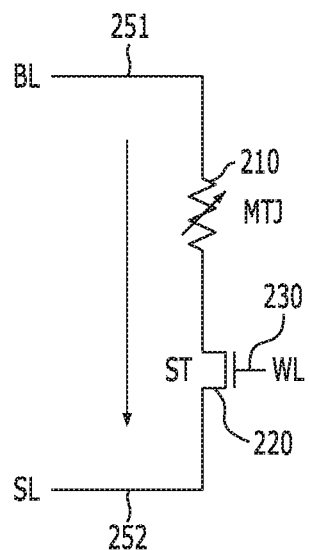
FIGS. 2A and 2B are diagrams for explaining the principle that data is stored in a variable resistor 210.
Figure 2B:
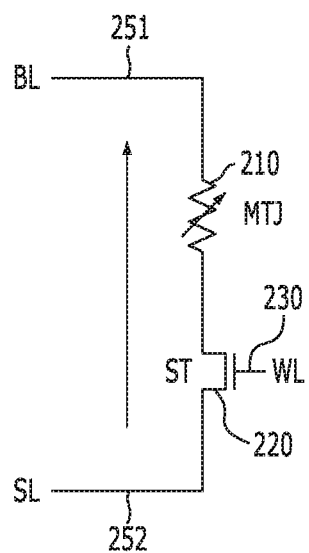

FIGS. 2A and 2B are diagrams for explaining the principle that data is stored in a variable resistor 210. The variable resistor 210 may include the MTJ 100 described with reference to FIG. 1.

FIG. 2A is a diagram for explaining the principle that low data is stored in the variable resistor 210. In order to select the variable resistor 210 in which data is intended to be stored, a word line 230 coupled to the variable resistor 210 is activated to turn on a transistor 220. Then, when a current flows from one end 251 toward the other end 252, that is, from the first electrode layer 110 as the top electrode to the second electrode layer 120 as the bottom electrode of the MTJ 100 in FIG. 1 (arrow direction), the magnetization direction of the first magnetic layer 110 as the free magnetic layer becomes parallel to the magnetization direction of the second magnetic layer 122 as the pinned magnetic layer, and the variable resistor 210 has a low resistance state. When the variable resistor 210 has a low resistance state, it is defined that low data is stored in the variable resistor 210.

FIG. 2B is a diagram for explaining the principle that high data is stored in the variable resistor 210. Similarly, the word line 230 coupled to the variable resistor 210 is activated to turn on the transistor 220. Then, when a current flows from the other end 252 to the one end 251, that is, from the second electrode layer 120 to the first electrode layer 110 (arrow direction), the magnetization direction of the first magnetic layer 112 becomes anti-parallel to the magnetization direction of the second magnetic layer 122, and the variable resistor 210 has a high resistance state. When the variable resistor 210 has a high resistance state, it is defined that high data is stored in the variable resistor 210.

FIGS. 3-7 show examples of memory circuits (device) having resistance variable elements as described above and circuit drivers that are connected via conductor lines.

Figure 3:
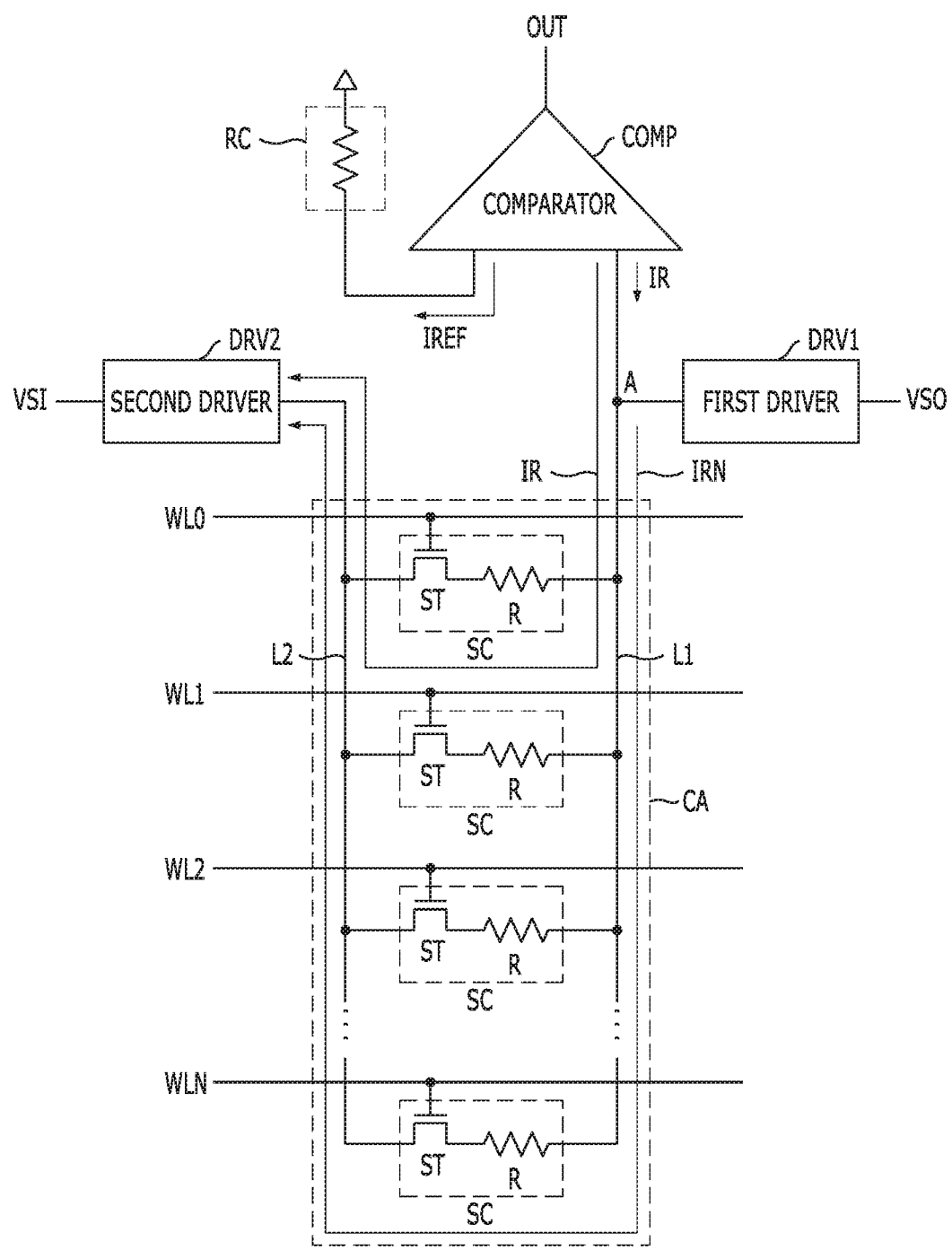
FIG. 3 is an example of a configuration diagram of a memory circuit (device) including a variable resistor.

FIG. 3 is an example of a configuration diagram of a memory circuit (device) including a variable resistor.

Referring to FIG. 3, a semiconductor device 300 includes a cell array 310 (CA) which includes a plurality of storage cells SC, a first conductor line L1 electrically coupled to one of two terminals 251 and 252 of the cells shown in FIG. 2A or 2B of the cell array 310, a second conductor line L2 electrically coupled to the other of two terminals 251 and 252 of the cells shown in FIG. 2A or 2B of the cell array 310, a first driver 320 (DRV1) electrically coupled to the first line L1 for driving the cell array 310, a second driver 330 (DRV2) electrically coupled to the second line L1 for driving the cell array 310, a reference cell 370 (RC), and a comparator 340 (COMP) coupled to the first line L1 for reading out each cell in the cell array 310.

The first line L1 is connected to one ends of the plurality of storage cells SC to apply a first electrical signal such as a source voltage VSO as shown in FIG. 3, and the second line L2 is connected to the other ends of the plurality of storage cells SC in the cell array 310 to apply a second, different electrical signal such as a sink voltage VSI as shown in FIG. 3. The first driver 320 (DRV1) is connected to one end contact point A (corresponding to one side direction of the cell array 310) of the first line L1, and the second driver 320 (DRV2) is connected to one end contact point B (corresponding to the one side direction of the cell array 310) of the second line L2. Each of the plurality of storage cells SC includes a select transistor 220 (ST) and a resistance variable element 210 (R) as shown in FIG. 2A or 2B. The plurality of storage cells SC correspond to a plurality of word lines WL0 to WLN as shown by the word line 230 coupled to the gate of the select transistor 220 in FIG. 2A or 2B. The word lines WL0 to WLN are respectively connected to select transistors ST which are included in respective storage cells SC associated with the word lines WL0 to WLN.

Notably in FIG. 3, the contact point A between the first driver 320 and the cell array 310 on the first line L1 and the contact point B between the second driver 330 and the cell array 310 on the second line L2 are located on the same side of the storage cells of the cell array 310, e.g., on the upper side of the storage cells of the cell array 310 in the example shown in FIG. 3. As such, a current caused by the application of the first and second electrical signals by the first and second drivers 320 and 330 on two sides of each storage cell in the cell array 310 will flow into the cell array 310 from either contact point A or B from the top, will path through a particular storage cell and will leave the cell array 310 from the contact point B or A from the top. Therefore, the current path length for a particular current for a particular cell that enters and exits the cell array 310 at the contact points A and B depends on the location of the particular storage cell in the cell array 310: the current path lengths for the storage cells on the top part of the cell array 310 are shorter than the current path lengths for the storage cells on the bottom part of the cell array 310.

Hereinbelow, a technical problem associated with the above semiconductor device is 300 in FIG. 3 is described with respect to a read operation for reaching a storage cell.

The semiconductor device 300 activates one word line among the plurality of word lines WL0 to WLN in the cell array 310 in response to an address in the read operation. The select transistor 220 (ST) connected to the activated word line is turned on, and accordingly, the storage cell SC corresponding to the activated word line may conduct a current for the read operation. The first driver 320 (DRV1) applies a source voltage VSO to the one end A of the first line L1 above the storage cells, and the second driver 330 (DRV2) applies a sink voltage VSI to the one end B of the second line L2 above the storage cells. By applying the voltages VSO and VSI to the first line L1 and the second line L2, a read current IR flows from the one end A of the first line L1 which is applied with the source voltage VSO to the one end B of the second line L2 which is applied with the sink voltage VSI, through the selected storage cell SC. Also, as the source voltage VSO and the sink voltage VSI are respectively applied to both ends of the reference cell RC, a reference current IREF flows in a conductor path connecting the reference cell 370 (RC) and the comparator 340. The magnitude of the read current IR varies according to the value stored in the storage cell SC (that is, the resistance value of the storage cell). The comparator 340 (COMP) has a current port coupled to the contact point A in the first line L1, compares the values of the read current IR and the reference current IREF, and outputs a comparison result to an output node OUT. The comparison result corresponds to the value stored in the storage cell SC.

In practical devices implementing the memory circuit in FIG. 3 with the contact points A and B on the same side of the storage cells of the cell array 310, parasitic components (parasitic capacitance, etc.) may be present, e.g., in the first line L1 and the second line L2 and the effects of such parasitic components for operations of different storage cells may vary with locations of the storage cells due to the different current path lengths of the different storage cells. Thus, not only the resistance value of the storage cell SC varies, but also the magnitude of the read current IR varies with a specific path of the read current IR. Due to this fact, in the case where the position of the selected storage cell SC is changed, the path length of the current flowing through a particular storage cell is changed from one storage cell to another and the magnitude of the read current IR becomes different for different storage cells even though the value stored in the storage cells may be the same. For example, in the case where the word line WLN for the bottom storage cell is activated, a path IRN of the read current IR is longer than the path for any other storage cell in FIG. 3, and an influence by the parasitic components of the lines L1 and L2 is added into this longer path. Conversely, in the case where the word line WL0 for the top storage cell is activated, a path IR0 of the read current IR is shorter than any other storage cell in FIG. 3, and an influence by the parasitic components of the lines L1 and L2 is reduced to a lesser amount in comparison with the influence by the parasitic components for other storage cells. Therefore, even though the values stored in the storage cell SC corresponding to the word line WL0 and the storage cell SC corresponding to the word line WLN are the same with each other, the magnitudes of the read current IR for these two storage cells are different from each other depending on the storage cell positions in the array. Consequently, as the margin of the read operation decreases, the probability of an error to occur in the read operation increases. This variation in current with the storage cell position in FIG. 3 is undesirable and can degrade the performance of the memory circuit.

Figure 4:
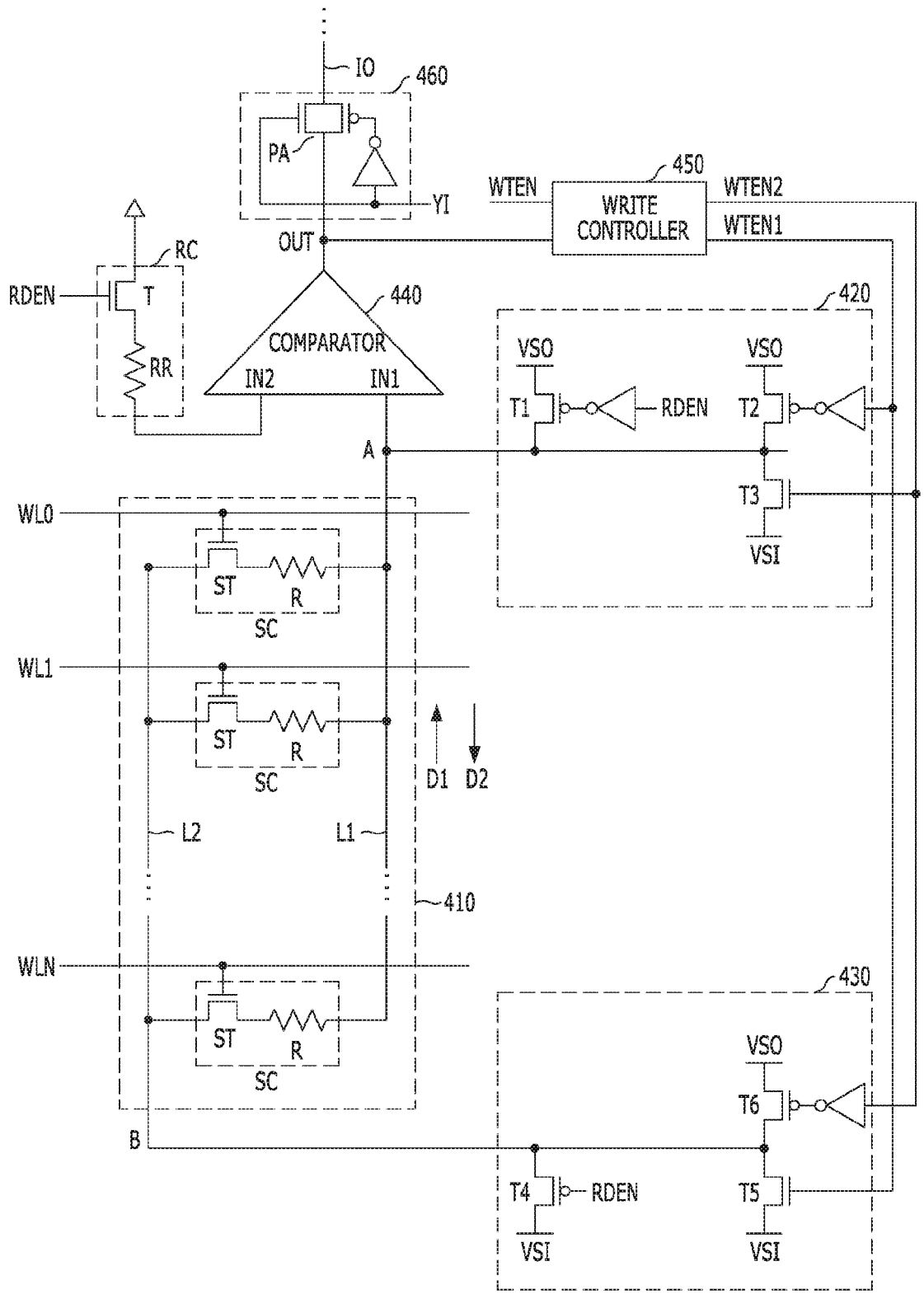
FIG. 4 is an example of a configuration diagram of a memory circuit (device) including a variable resistor.

FIG. 4 is an example of a configuration diagram of a semiconductor device 400 based on one implementation of the disclosed technology where the locations of the two contact points A and B are located on two opposite sides of the storage cells in the cell array to mitigate the varying current path length issue based on storage cell locations in FIG. 3.

Referring to FIG. 4, the semiconductor device 400 includes a cell array 410 which includes a plurality of storage cells SC, a first line L1 which is connected to one ends of the plurality of storage cells SC, a second line L2 which is connected to the other ends of the plurality of storage cells SC, a first driver 420 which is connected to one end A of the first line L1 corresponding to one side direction D1 of the cell array 410 and applies a source voltage VSO or a sink voltage VSI to the one end A of the first line L1, and a second driver 430 which is connected to one end B of the second line L2 corresponding to the other side direction D2 of the cell array 410 and applies the source voltage VSO or the sink voltage VSI to the one end B of the second line L2.

Also, the semiconductor device 400 includes a reference cell RC which has a reference resistance value, and a comparator 440 which has a first input terminal IN1 connected to one of the first line L1 and the second line L2 and a second input terminal IN2 connected to the reference cell RC, compares the resistance value of a storage cell selected among the plurality of storage cells SC and the reference resistance value in a read operation, and outputs a comparison result. Different from the design in FIG. 3, the contact points A and B are located on two opposite sides of the storage cells in the cell array 410 so that different current paths between the contact points A and B for different storage cells have substantially the same current path length. Under this circuit design, the currents passing through different storage cells in the cell array 410 are subject to, essentially, the same amount of a current-path-dependent influence, e.g., resistance, capacitance, attenuation and others, caused by circuit elements in the different current paths and associated parasitic circuit elements.

In the cell array 410, the first line L1 may be a bit line, and the second line L2 may be a source line. Each of the storage cells SC includes a resistance variable element 210 (R) of which resistance value varies according to the value of the data stored therein, and a select transistor 220 (ST), as shown in FIG. 2A or 2B. The resistance variable element 210 (R) may have a first resistance value (a low resistance state) in the case where first (low) data is stored in the storage cell SC and may have a second resistance value (a high resistance state) higher than the first resistance value in the case where second (high) data is stored in the storage cell SC. If the word line connected to the select transistor ST is activated, the select transistor ST is turned on, and a current may flow through both ends of the storage cell SC in one of the two directions as illustrated in FIGS. 2A and 2B.

The first driver 420 is connected to the one end A of the first line L1 which is positioned in the one side direction D1 of the cell array 410, and applies the source voltage VSO or the sink voltage VSI to the one end A of the first line L1. In detail, the first driver 420 applies one voltage of the source voltage VSO and the sink voltage VSI to the one end A of the first line L1 in the read operation. While it is shown in FIG. 4 that the first driver 420 applies the source voltage VSO to the one end A of the first line L1 in the read operation while the second driver 430 apples the sink voltage VSI, a design may be made such that the first driver 420 applies the sink voltage VSI while the second driver 430 applied the source voltage VSO.

Further, the first driver 420 applies one voltage of the source voltage VSO and the sink voltage VSI according to the value of data to be written in the selected storage cell, to the one end A of the first line L1 in a write operation. While it is shown in FIG. 4 that, in the write operation, the first driver 420 applies the source voltage VSO to the one end A of the first line L1 in the case where the first driver 420 is to store the first data in the selected storage cell SC and applies the sink voltage VSI to the one end A of the first line L1 in the case where the first driver 420 is to store the second data in the selected storage cell SC, a design may be made such that voltages are oppositely applied according to the value of data to be stored.

For the above operation, the first diver 420 includes a first transistor T1 which has one end applied with the source voltage VSO and the other end connected to the one end A of the first line L1, is turned on in the read operation and applies the source voltage VSO to the one end A of the first line L1, a second transistor T2 which has one end applied with the source voltage VSO and the other end connected to the one end A of the first line L1, is turned on in the case where the first data is to be written in the selected storage cell SC and applies the source voltage VSO to the one end A of the first line L1, and a third transistor T3 which has one end applied with the sink voltage VSI and the other end connected to the one end A of the first line L1, is turned on in the case where the second data is to be written in the selected storage cell SC and applies the sink voltage VSI to the one end A of the first line L1.

The second driver 430 is connected to the one end B of the second line L2 which is positioned in the other side direction D2 of the cell array 410, and applies a voltage that is not applied to the one end A of the first line L1 between the source voltage VSO and the sink voltage VSI but is applied to the one end B of the second line L2. In detail, the second driver 430 applies the voltage that is not applied to the one end A of the first line L1 between the source voltage VSO and the sink voltage VSI but is applied to the one end B of the second line L2 in the read operation. While it is shown in FIG. 4 that the second driver 430 applies the sink voltage VSI to the one end B of the second line L2 in the read operation while the first driver 420 applied the source voltage VSO, a design may be made such that the second driver 430 applies the source voltage VSO while the first driver 420 applies the sink voltage VSI.

Further, the second driver 430 applies a voltage not applied to the one end A of the first line L1 between the source voltage VSO and the sink voltage VSI, according to the value of data to be written in the selected storage cell, to the one end B of the second line L2 in the write operation. While it is shown in FIG. 4 that, in the write operation, the second driver 430 applies the sink voltage VSI to the one end B of the second line L2 in the case where the second driver 430 is to store the first data in the selected storage cell SC and applies the source voltage VSO to the one end B of the second line L2 in the case where the second driver 430 is to store the second data in the selected storage cell SC, a design may be made such that voltages are oppositely applied according to the value of data to be stored.

For the above operation, the second diver 430 includes a fourth transistor T4 which has one end applied with the sink voltage VSI and the other end connected to the one end B of the second line L2, is turned on in the read operation and applies the sink voltage VSI to the one end B of the second line L2, a fifth transistor T5 which has one end applied with the sink voltage VSI and the other end connected to the one end B of the second line L2, is turned on in the case where the first data is to be written in the selected storage cell SC and applies the sink voltage VSI to the one end B of the second line L2, and a sixth transistor T6 which has one end applied with the source voltage VSO and the other end connected to the one end B of the second line L2, is turned on in the case where the second data is to be written in the selected storage cell SC and applies the source voltage VSO to the one end B of the second line L2.

The semiconductor device 400 includes a reference cell 470 (RC) which has the reference resistance value to discriminate the resistance value of the selected storage cell SC in the read operation. The reference resistance value has a value that is higher than a first resistance value and is lower than a second resistance value. Accordingly, the resistance value of the storage cell SC in which the first data is stored is smaller than the reference resistance value, and the resistance value of the storage cell SC in which the second data is stored is larger than the reference resistance value. The reference cell RC includes a reference resistance element RR which has the reference resistance value and a transistor T which is turned on in the read operation.

The comparator 440 compares the resistance value of the selected storage cell SC and the reference resistance value of the reference cell 470 (RC) and outputs a comparison result in the read operation. For this operation, the first input terminal IN1 of the comparator 440 is connected to one of the first line L1 and the second line L2, and the second input terminal IN2 is connected to the reference cell 470 (RC). FIG. 4 shows the case where the first input terminal IN1 of the comparator 440 is connected to the one end A of the first line L1.

In detail, in the read operation, the first input terminal IN1 of the comparator 440 and the one end A of the first line L1 are electrically connected, and the second input terminal IN2 of the comparator 440 and one end of the reference cell RC are electrically connected. The comparator 440 receives a current flowing from the one end A of the first line L1 through the selected storage cell SC to the one end B of the second line L2 and another current flowing through the reference cell 470 (RC), through the first input terminal IN1 and the second input terminal IN2, respectively, and compares the received two currents. The comparator 440 outputs a result of comparing the magnitudes of the currents flowing through the first input terminal IN1 and the second input terminal IN2. The magnitude of the current flowing through the first input terminal IN1 increases as the resistance value of the selected storage cell SC reduces, and, conversely, the current flowing through the first input terminal IN1 reduces as the resistance value of the selected storage cell SC increases. The current flowing through the second input terminal IN2 has a constant value. Accordingly, the result of comparing the magnitudes of the current flowing through the first input terminal IN1 and the second input terminal IN2 corresponds to the result of comparing the resistance values of the selected storage cell SC and the reference cell RC.

For example, in the case where the magnitude of the current flowing through the first input terminal IN1 is larger than the magnitude of the current flowing through the second input terminal IN2, the data stored in the selected storage cell SC may be the first data, and, in the case where the magnitude of the current flowing through the first input terminal IN1 is smaller than the magnitude of the current flowing through the second input terminal IN2, the data stored in the selected storage cell SC may be the second data.

A write controller 450 is provided in the device 400 in FIG. 4 to control the first driver 420 and the second driver 430 according to the value of data which is to be written in the selected storage cell SC, in the write operation. In the specific example in FIG. 4, the writer controller 450 is coupled to the gate of T3 in the first driver 420, the gate of T5 in the second driver 430 and the output of the comparator 440. In the case of writing the first data in the selected storage cell SC, the first driver 420 is caused to apply the source voltage VSO to the one end A of the first line L1, and the second driver 430 is caused to apply the sink voltage VSI to the one end B of the second line L2. Further, in the case of writing the second data in the selected storage cell SC, the first driver 420 is caused to apply the sink voltage VSI to the one end A of the first line L1, and the second driver 430 is caused to apply the source voltage VSO to the one end B of the second line L2.

The device 400 in FIG. 4 further includes a data transferer 460 that transfers the output of the comparator 440 to an input/output line I/O when a select signal YI is activated in the read operation, and transfers the data of the input/output line IO to the write controller 450 when the select signal YI is activated in the write operation. The output of the comparator 440 in the read operation corresponds to the data read from the selected storage cell SC, and the data transferred to the write controller 450 in the write operation corresponds to data to be written in the selected storage cell SC. The data transferer 460 may include a pass gate PA which is turned on and off according to the select signal YI.

In FIG. 4, the above described circuits 440, 450, 460 and 470 can be configured as part of a memory control circuit that controls the operations of the device 400. The memory control circuit also generates the memory cell select control signals on the WL0, WL1, . . . and WLN to activate select memory cells by controlling the gate voltages of select transistors 220 shown in FIG. 2A or 2B.

While only one cell array 410 is shown in FIG. 4, the semiconductor device 400 may be implemented to include a plurality of cell arrays, and, to select one cell array among the plurality of cell arrays, an address may be received and one select signal YI may be activated among a plurality of select signals YI which respectively correspond to the plurality of cell arrays.

In the semiconductor device 400, the source voltage VSO is a voltage which has a voltage level higher than the sink voltage VSI, and thus, current flows from a node to which the source voltage VSO is applied to a node to which the sink voltage VSI is applied. For example, in the case where the first driver 420 applies the source voltage VSO to the one end A of the first line L1 and the second driver 430 applies the sink voltage VSI to the one end B of the second line L2, current flows from the one end A of the first line L1 to the one end B of the second line L2 through the storage cell SC selected among the plurality of storage cells SC. Also, in the case where the first driver 420 applies the sink voltage VSI to the one end A of the first line L1 and the second driver 430 applies the source voltage VSO to the one end B of the second line L2, current flows from the one end B of the second line L2 to the one end A of the first line L1 through the storage cell SC selected among the plurality of storage cells SC. The source voltage VSO may be a power supply voltage VDD which is used as a power source in the semiconductor device, and the sink voltage VSI may be a ground voltage GND.

Additional features of the read operation and the write operation of the semiconductor device 400 in FIG. 4 are described based on the above described below.

(1) Read operation in the device 400 in FIG. 4

In the case where the semiconductor device 400 performs the read operation, a read enable signal RDEN is activated, and a write enable signal WTEN is deactivated. The first transistor T1 and the fourth transistor T4 are turned on in response to the read enable signal RDEN. Accordingly, the source voltage VSO is applied to the one end A of the first line L1, and the sink voltage VSI is applied to the one end B of the second line L2. The write controller 450 deactivates both a first write signal WTEN1 and a second write signal WTEN2 in the case where the write enable signal WTEN is deactivated. Since both the first write signal WTEN1 and the second write signal WTEN2 are deactivated, the second transistor T2, the third transistor T3, the fifth transistor T5 and the sixth transistor T6 are all turned off.

Also, a word line corresponding to the address inputted to the semiconductor device 400 is activated among the plurality of word lines WL0 to WLN, and a storage cell SC corresponding to the activated word line is selected among the plurality of storage cells SC. Since the selected storage cell SC may conduct current, a current flows from the one end A of the first line L1 through the selected storage cell SC to the one end B of the second line L2. Moreover, as the transistor T of the reference cell 470 (RC) is turned on in response to the read enable signal RDEN, a current also flows through the reference cell 470 (RC).

When the read enable signal RDEN is activated, the comparator 440 outputs a result of comparing the current flowing through the first input terminal IN1 and the current flowing through the second input terminal IN2, to an output node OUT. Since the select signal YI is activated in the case where the cell array 410 shown in FIG. 4 is selected, the output of the comparator 440 is transferred to the input/output line IO.

(2) Write operation in the device 400 in FIG. 4

In the case where the semiconductor device 400 performs the write operation, the write enable signal WTEN is activated, and the read enable signal RDEN is deactivated. Since the select signal YI is activated in the case where the cell array 410 shown in FIG. 4 is selected, the data of the input/output line IO is transferred to the write controller 450. The write controller 450 activates one of the first write signal WTEN1 and the second write signal WTEN2 in response to the write enable signal WTEN and the data transferred from the input/output line IO. The first write signal WTEN1 is a signal which is activated in the case where the first data is to be written in the selected storage cell SC, and the second write signal WTEN2 is a signal which is activated in the case where the second data is to be written in the selected storage cell SC.

In detail, in the case where the write enable signal WTEN is activated, the write controller 450 activates the first write signal WTEN1 when the data transferred from the input/output line IO is the first data, and activates the second write signal WTEN2 when the data transferred from the input/output line IO is the second data. At this time, in the same manner as in the read operation, a storage cell SC corresponding to an activated word line is selected.

In the case where the first write signal WTEN1 is activated, the second transistor T2 and the fifth transistor T5 are turned on to cause a current to flow from the one end A of the first line L1 through the selected storage cell SC to the one end B of the second line L2. The first data is written in the selected storage cell SC by the current flowing at this time.

In the case where the second write signal WTEN2 is activated, the third transistor T3 and the sixth transistor T6 are turned on to cause a current to flow from the one end B of the second line L2 through the selected storage cell SC to the one end A of the first line L1. The second data is written in the selected storage cell SC by the current flowing at this time.

For reference, in FIG. 4, the one side direction D1 of the cell array 410 represents the upper end of the cell array 410, and the other side direction D2 of the cell array 410 represents the lower end of the cell array 410. According to a design, the first driver 420 may be disposed at the lower end of the cell array 410, and the second driver 430 may be disposed at the upper end of the cell array 410. In the semiconductor device of FIG. 4, the first driver 420 and the second driver 430 are disposed opposite to each other when viewed from the cell array 410. Therefore, the current for reading or writing the selected storage cell SC flows through the lower end and the upper end of the cell array 410.

Figure 5:
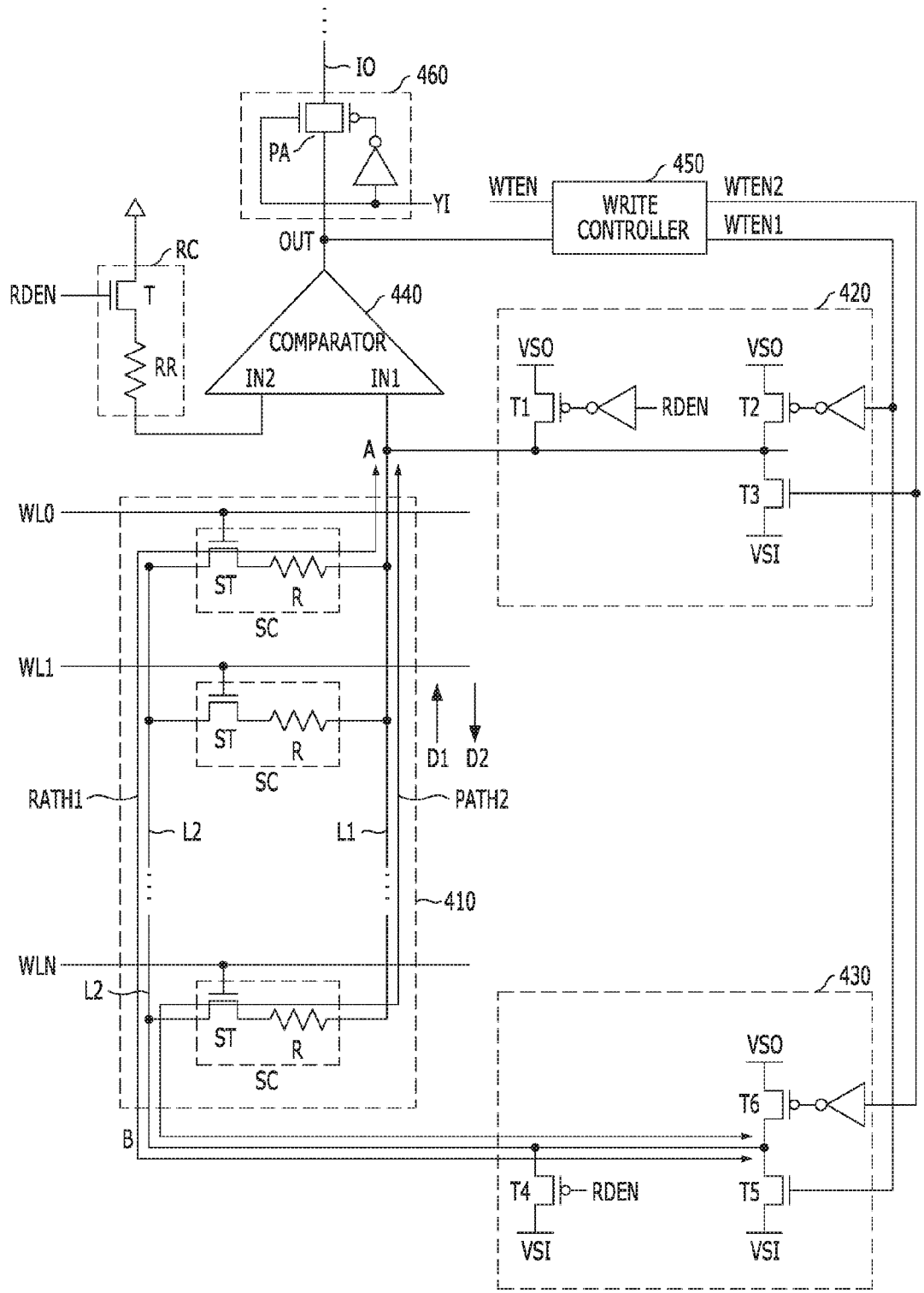
FIG. 5 is a diagram explaining the effects of the memory circuit (device) shown in FIG. 4.

FIG. 5 is an example of a diagram explaining the effects of the semiconductor device shown in FIG. 4.

In FIG. 5, effects of the semiconductor device shown in FIG. 4 will be described below by exemplifying the case of reading or writing data from or to the storage cell SC corresponding to the word line WL0 among the plurality of storage cells SC and the case of reading or writing data from or to the storage cell SC corresponding to the word line WLN among the plurality of storage cells SC.

First, in the case of reading or writing data from or to the storage cell SC corresponding to the word line WL0, the current caused by the first driver 420 and the second driver 430 flows along a first path PATH1 which includes the one end A of the first line L1, the storage cell SC corresponding to the word line WL0 and the one end B of the second line L2.

Next, in the case of reading or writing data from or to the storage cell SC corresponding to the word line WLN, the current caused by the first driver 420 and the second driver 430 flows along a second path PATH2 which includes the one end A of the first line L1, the storage cell SC corresponding to the word line WLN and the one end B of the second line L2.

By comparing the first path PATH1 and the second path PATH2, it can be seen that the lengths of the two paths PATH1 and PATH2 are substantially the same. In other words, paths through which the current flowing to read or write data from or to selected storage cells SC passes are the same regardless of the positions of the selected storage cells SC. Therefore, parasitic components (for example, the parasitic capacitance of the lines L1 and L2 as described above with reference to FIG. 3) which exert influences on the magnitudes of the current flowing to read or write data from or to the selected storage cells SC are the same regardless of the positions of the selected storage cells SC.

If the influences exerted by parasitic components become the same for all the storage cells SC, since the amounts of the current flowing through selected storage cells SC in the write operation become the same regardless of the positions of the selected storage cells SC, it is possible to precisely write data regardless of the positions of the selected storage cells SC. Further, because a difference in the amounts of the current flowing through the selected storage cells SC in the read operation is changed not by parasitic components but only according to the values of the data stored in the selected storage cells SC, it is possible to precisely read data regardless of the positions of the selected storage cells SC.

Therefore, the semiconductor device 400 includes a cell array 410 which includes a plurality of storage cells SC, a first line L1 which is connected to one ends of the plurality of storage cells SC, and a second line L2 which is connected to the other ends of the plurality of storage cells SC, wherein, in a read/write operation, the current flows between one end A of the first line L1 corresponding to one side direction D1 of the cell array 410 and one end B of the second line L2 corresponding to the other side direction D2 of the cell array 410.

The semiconductor device 400 operates such that the current flows between the one end A of the first line L1 and the one end B of the second line L2 in the read or write operation, and the current flows through a selected storage cell SC. Influences exerted on the amounts of current flowing through selected storage cells SC by the parasitic components of the lines L1 and L2 are proportional to the lengths of paths through which current to pass through the selected storage cells SC flows. In this regard, since paths through which the current to pass through the selected storage cells SC flows have the same length, the influences exerted on the amounts of the current flowing through the selected storage cells SC by the parasitic components of the lines L1 and L2 are the same regardless of the positions of the selected storage cells SC.

Figure 6:
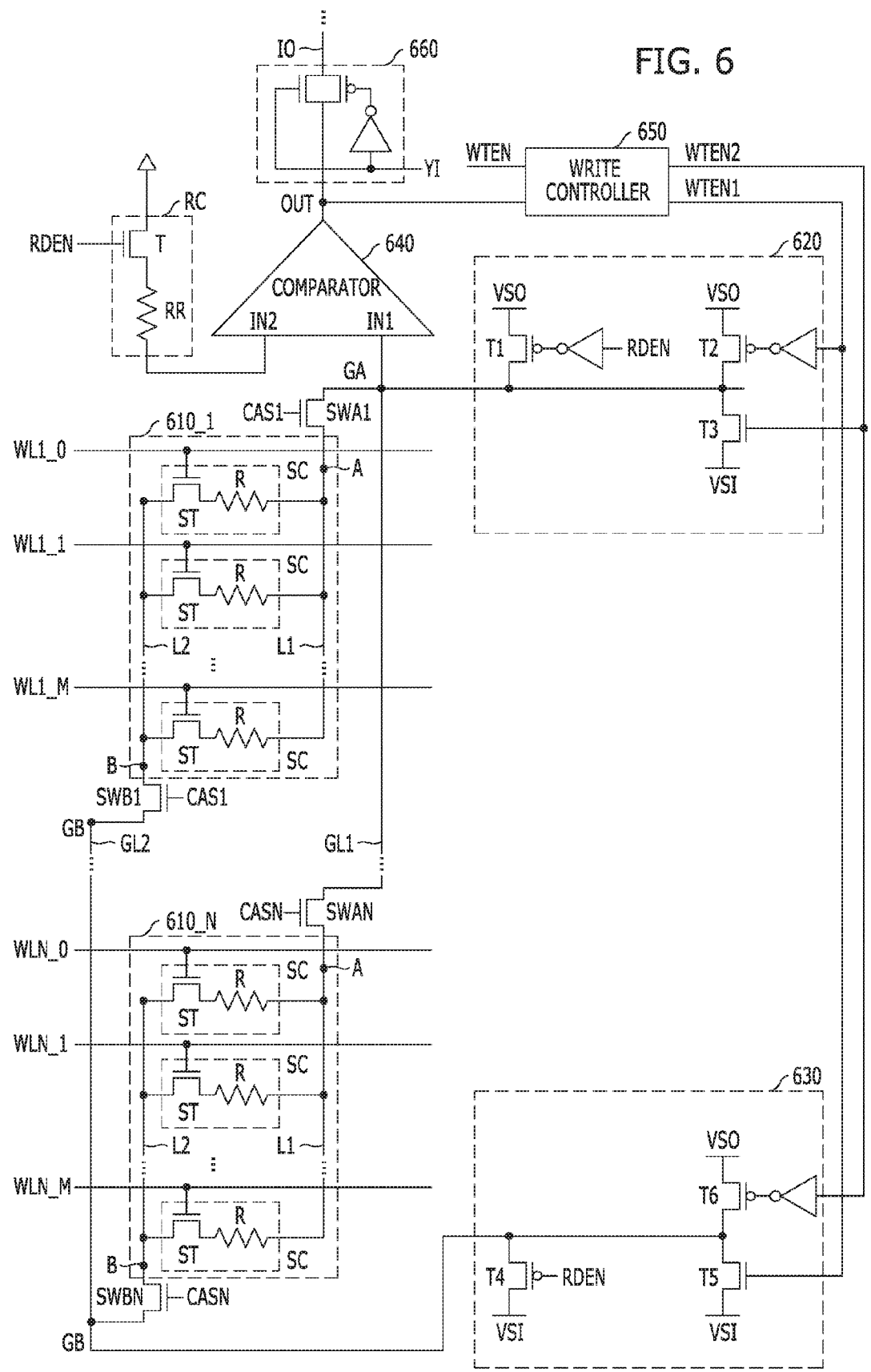
FIG. 6 is an example of a configuration diagram of a memory circuit (device) including a variable resistor.

FIG. 6 is an example of a configuration diagram of a semiconductor device 600 based on another implementation of the disclosed technology.

Referring to FIG. 6, the semiconductor device 600 includes first to $N^{th}$ cell arrays 610_1 to 610_N each of which includes a plurality of storage cells SC, a first line L1 connected to one ends of the plurality of storage cells SC and a second line L2 connected to the other ends of the plurality of storage cells SC, a first global line GL1 which is electrically connected with one end A of the first line L1 of a cell array selected among the first to $N^{th}$ cell arrays 610_1 to 610_N, a second global line GL2 which is electrically connected with one end B of the second line L2 of the selected cell array, a first driver 620 which is connected to one end GA of the first global line GL1 corresponding to one side direction D1 of the first cell array 610_1 and applies a source voltage VSO or a sink voltage VSI to the one end GA of the first global line GL1, and a second driver 630 which is connected to one end GB of the second global line GL2 corresponding to the other side direction D2 of the $N^{th}$ cell array 610_N and applies the source voltage VSO or the sink voltage VSI to the one end GB of the second global line GL2. Also, the semiconductor device 600 includes a reference cell RC which has a reference resistance value, and a comparator 640 which has a first input terminal IN1 connected to one of the first global line GL1 and the second global line GL2 and a second input terminal IN2 connected to the reference cell RC, compares the resistance value of a storage cell selected among the plurality of storage cells SC of a cell array selected among the first to $N^{th}$ cell arrays 610_1 to 610_N and the reference resistance value in a read operation, and outputs a comparison result.

The semiconductor device 600 further includes first to $N^{th}$ one side switches SWA1 to SWAN which are connected between one ends A of first lines L1 of the first to $N^{th}$ cell arrays 610_1 to 610_N and the first global line GL1 and are turned on when cell arrays connected to them are selected among the first to $N^{th}$ cell arrays 610_1 to 610_N, and first to $N^{th}$ other side switches SWB1 to SWBN which are connected between one ends B of second lines L2 of the first to $N^{th}$ cell arrays 610_1 to 610_N and the second global line GL2 and are turned on when cell arrays connected to them are selected among the first to $N^{th}$ cell arrays 610_1 to 610_N.

In the first to $N^{th}$ cell arrays 610_1 to 610_N in FIG. 6, each of the first to $N^{th}$ cell arrays 610_1 to 610_N includes the plurality of storage cells SC which are connected between the first line L1 and the second line L2. Hereinbelow, descriptions will be made for the case where each cell array includes M number of storage cells. The first L1 may be a bit line, and the second line L2 may be a source line. The first to $N^{th}$ cell arrays 610_1 to 610_N are connected between the first global line GL1 and the second global line GL2. The first global line GL1 may be a global bit line, and the second global line GL2 may be a global source line. The configuration and the characteristic of the storage cell SC are as described above with reference to FIG. 4.

A $K^{th}$ ($1 \leq K \leq N$) one side switch SWAK among the first to $N^{th}$ one side switches SWA1 to SWAN is connected between the one end A of the first line L1 of a $K^{th}$ cell array 610_K among the first to $N^{th}$ cell arrays 610_1 to 610_N and the first global line GL1, and a $K^{th}$ ($1 \leq K \leq N$) other side switch SWBK among the first to $N^{th}$ other side switches SWB1 to SWBN is connected between the one end B of the second line L2 of the $K^{th}$ cell array 610_K and the second global line GL2. The one end A of the first line L1 of the $K^{th}$ cell array 610_K corresponds to one side direction D1 of the $K^{th}$ cell array 610_K, and the one end B of the second line L2 of the $K^{th}$ cell array 610_K corresponds to the other side direction D2 of the $K^{th}$ cell array 610_K.

The semiconductor device 600 selects one cell array among the first to $N^{th}$ cell arrays 610_1 to 610_N in response to an inputted address (not shown). To this end, the semiconductor device 600 activates one cell array select signal among a plurality of cell array select signals CAS1 to CASN which respectively correspond to the first to $N^{th}$ cell arrays 610_1 to 610_N, in response to the inputted address. In response to the activated cell array select signal, one of the first to $N^{th}$ one side switches SWA1 to SWAN and one of the first to $N^{th}$ other side switches SWB1 to SWBN are turned on, by which one end A of the first line L1 of the selected cell array and the first global line GL1 are electrically connected and one end B of the second line L2 of the selected cell array and the second global line GL2 are electrically connected.

For example, in the case where the first cell array 610_1 is selected by the inputted address, as the first cell array select signal CAS1 is activated and the first one side switch SWA1 and the first other side switch SWB1 are turned on, the one end A of the first line L1 of the first cell array 610_1 and the first global line GL1 are electrically connected, and the one end B of the second line L2 of the first cell array 610_1 and the second global line GL2 are electrically connected.

The first driver 620 is connected to the one end GA of the first global line GL1 which is positioned in the one side direction D1 of the first cell array 610_1, and applies the source voltage VSO or the sink voltage VSI to the one end GA of the first global line GL1. In detail, the first driver 620 applies one voltage of the source voltage VSO and the sink voltage VSI to the one end GA of the first global line GL1 in the read operation. While it is shown in FIG. 6 that the first driver 620 applies the source voltage VSO to the one end GA of the first global line GL1 in the read operation while the second driver 630 applies the sink voltage VSI, a design may be made such that the first driver 620 applies the sink voltage VSI while the second driver 630 applies the source voltage VSO.

Further, the first driver 620 applies one voltage of the source voltage VSO and the sink voltage VSI according to the value of data to be written in a storage cell (MC) (hereinafter, referred to as a selected storage cell SC) selected among the plurality of storage cells of the selected cell array, to the one end GA of the first global line GL1 in a write operation. While it is shown in FIG. 6 that, in the write operation, the first driver 620 applies the source voltage VSO to the one end GA of the first global line GL1 in the case where the first driver 620 is to store first data in the selected storage cell SC and applies the sink voltage VSI to the one end GA of the first global line GL1 in the case where the first driver 620 is to store second data in the selected storage cell SC, a design may be made such that voltages are oppositely applied according to the value of data to be stored.

In some implementations, the configuration and operations of the first driver 620 for the above operations may be the same as those of the first driver 420 of FIG. 4, except that transistors T1, T2 and T3 are connected to the one end GA of the first global line GL1.

The second driver 630 is connected to the one end GB of the second global line GL2 which is positioned in the other side direction D2 of the N$^{th}$ cell array 610_N, and applies a voltage not applied to the one end GA of the first global line GL1 between the source voltage VSO and the sink voltage VSI, to the one end GB of the second global line GL2. In detail, the second driver 630 applies the voltage not applied to the one end GA of the first global line GL1 between the source voltage VSO and the sink voltage VSI, to the one end GB of the second global line GL2 in the read operation. While it is shown in FIG. 6 that the second driver 630 applies the sink voltage VSI to the one end GB of the second global line GL2 in the read operation while the first driver 620 applies the source voltage VSO, a design may be made such that the second driver 630 applies the source voltage VSO while the first driver 620 applies the sink voltage VSI.

Further, the second driver 630 applies a voltage not applied to the one end GA of the first global line GL1 between the source voltage VSO and the sink voltage VSI, according to the value of data to be written in the selected storage cell SC, to the one end GB of the second global line GL2 in the write operation. While it is shown in FIG. 6 that, in the write operation, the second driver 630 applies the sink voltage VSI to the one end GB of the second global line GL2 in the case where the second driver 630 is to store the first data in the selected storage cell SC and applies the source voltage VSO to the one end GB of the second global line GL2 in the case where the second driver 630 is to store the second data in the selected storage cell SC, a design may be made such that voltages are oppositely applied according to the value of data to be stored.

In addition, the configuration and operations of the second driver 630 for the above operations may be the same as those of the second driver 430 of FIG. 4, except that transistors T4, T5 and T6 are connected to the one end GB of the second global line GL2.

The configurations and operations of the reference cell RC and the comparator 640 can be the same as those of the reference cell RC and comparator 440 of FIG. 4. One difference from FIG. 4 is that the first input terminal IN1 of the comparator 640 is connected to one of the first global line GL1 and the second global line GL2. FIG. 6 shows the case where the first input terminal IN1 of the comparator 640 is connected to the one end GA of the first global line GL1.

The comparator 640 compares current flowing through the one end GA of the first global line GL1, the one end A of the first line L1 of the selected cell array, the selected storage cell SC, the one end B of the second line L2 of the selected cell array and the one end GB of the second global line GL2 with current flowing through the reference cell RC, and determines whether the resistance value of the selected storage cell SC is larger than the reference resistance value, that is, which data is stored in the selected storage cell SC.

The configurations and operations of a write controller 650 and a data transferer 660 can be substantially the same as those of the write controller 450 and the data transferer 460 of FIG. 4. One difference from FIG. 4 is that the write controller 650 controls the first driver 620 to apply the source voltage VSO or the sink voltage VSI not to the one end A of the first line L1 but to the one end GA of the first global line GL1 and controls the second driver 630 to apply the source voltage VSO or the sink voltage VSI not to the one end B of the second line L1 but to the one end GB of the second global line GL2. Although one set of the first to N$^{th}$ cell arrays 610_1 to 610_N and the corresponding comparator 640 is shown in FIG. 6, the semiconductor device 600 may include a plurality of such sets, and, in order to select one set among the plurality of such sets, one of a plurality select signals YI respectively corresponding to the plurality of sets may be activated by receiving an address.

As in the case of FIG. 4, the source voltage VSO is a voltage which has a voltage level higher than the sink voltage VSI, and thus, current flows from a node to which the source voltage VSO is applied to a node to which the sink voltage VSI is applied. For example, in the case where the first driver 620 applies the source voltage VSO to the one end GA of the first global line GL1 and the second driver 630 applies the sink voltage VSI to the one end GB of the second global line GL2, the current flows from the one end GA of the first global line GL1 through the one end A of the first line L1 of the selected cell array, the selected storage cell SC and the one end B of the second line L2 of the selected cell array to the one end GB of the second global line GL2. In an opposite case, the current flows in a reverse order.

Additional features of the read operation and the write operation of the semiconductor device 600 are described below.

(1) Read operation in the device 600 in FIG. 6

In the case where the semiconductor device 600 performs the read operation, a read enable signal RDEN is activated, and a write enable signal WTEN is deactivated. The first transistor T1 and the fourth transistor T4 are turned on in response to the read enable signal RDEN. Accordingly, the source voltage VSO is applied to the one end GA of the first global line GL1, and the sink voltage VSI is applied to the one end GB of the second global line GL2. One cell array select signal is activated among the plurality of cell array select signals CAS1 to CASN. One end A of the first line L1 of a cell array corresponding to the activated cell array select signal is electrically connected with the first global line GL1, and one end B of the second line L2 of the cell array corresponding to the activated cell array select signal is electrically connected with the second global line GL2. The write controller 650 deactivates both a first write signal WTEN1 and a second write signal WTEN2 in the case where the write enable signal WTEN is deactivated. Since both the first write signal WTEN1 and the second write signal WTEN2 are deactivated, the second transistor T2, the third transistor T3, the fifth transistor T5 and the sixth transistor T6 are all turned off.

Also, a word line corresponding to the address inputted to the semiconductor device is activated among the plurality of word lines WL1_0 to WLN_M, and a storage cell SC corresponding to the activated word line in the selected cell array is selected. Since the selected storage cell SC may conduct a current, the current flows from the one end GA of the first global line GL1 through the selected storage cell SC to the one end GB of the second global line GL2. Moreover, as the transistor T of the reference cell RC is turned on in response to the read enable signal RDEN, current flows through the reference cell RC.

When the read enable signal RDEN is activated, the comparator 640 outputs a result of comparing the current flowing through the first input terminal IN1 and the current flowing through the second input terminal IN2, to an output node OUT. Since the select signal YI is activated in the case where the set of the cell arrays and the comparator 610_1 to 610_N and 640 shown in FIG. 6 is selected, the output of the comparator 640 is transferred to the input/output line IO.

(2) Write operation in the device 600 in FIG. 6

In the case where the semiconductor device 600 performs the write operation, the write enable signal WTEN is activated, and the read enable signal RDEN is deactivated. Since the select signal YI is activated in the case where the set of the cell arrays and the comparator 610_1 to 610_N and 640 shown in FIG. 6 is selected, the data of the input/output line IO is transferred to the write controller 650. The write controller 650 activates one of the first write signal WTEN1 and the second write signal WTEN2 in response to the write enable signal WTEN and the data transferred from the input/output line IO.

In detail, in the case where the write enable signal WTEN is activated, the write controller 650 activates the first write signal WTEN1 when the data transferred from the input/output line IO is the first data, and activates the second write signal WTEN2 when the data transferred from the input/output line IO is the second data. At this time, in the same manner as in the read operation, a storage cell SC corresponding to an activated word line is selected.

In the case where the first write signal WTEN1 is activated, the second transistor T2 and the fifth transistor T5 are turned on to cause a current to flow from the one end GA of the first global line GL1 through the selected storage cell SC to the one end GB of the second global line GL2. The first data is written in the selected storage cell SC by the current flowing at this time.

In the case where the second write signal WTEN2 is activated, the third transistor T3 and the sixth transistor T6 are turned on to cause a current to flow from the one end GB of the second global line GL2 through the selected storage cell SC to the one end GA of the first global line L1. The second data is written in the selected storage cell SC by the current flowing at this time.

For reference, in FIG. 6, the one side direction D1 of each of the cell arrays 610_1 to 610_N represents the upper end of each of the cell arrays 610_1 to 610_N, and the other side direction D2 of each of the cell arrays 610_1 to 610_N represents the lower end of each of the cell arrays 610_1 to 610_N. According to a design, the first driver 620 may be disposed at the lower end of the cell array 610_N, and the second driver 630 may be disposed at the upper end of the cell array 610_1. In the semiconductor device of FIG. 6, the first driver 620 and the second driver 630 are disposed opposite to each other when viewed from the sets of the cell arrays 610_1 to 610_N which share the global lines GL1 and GL2. Therefore, current for reading or writing of the selected storage cell SC flows through the lower end and the upper end of the set of the cell arrays 610_1 to 610_N.

Figure 7:
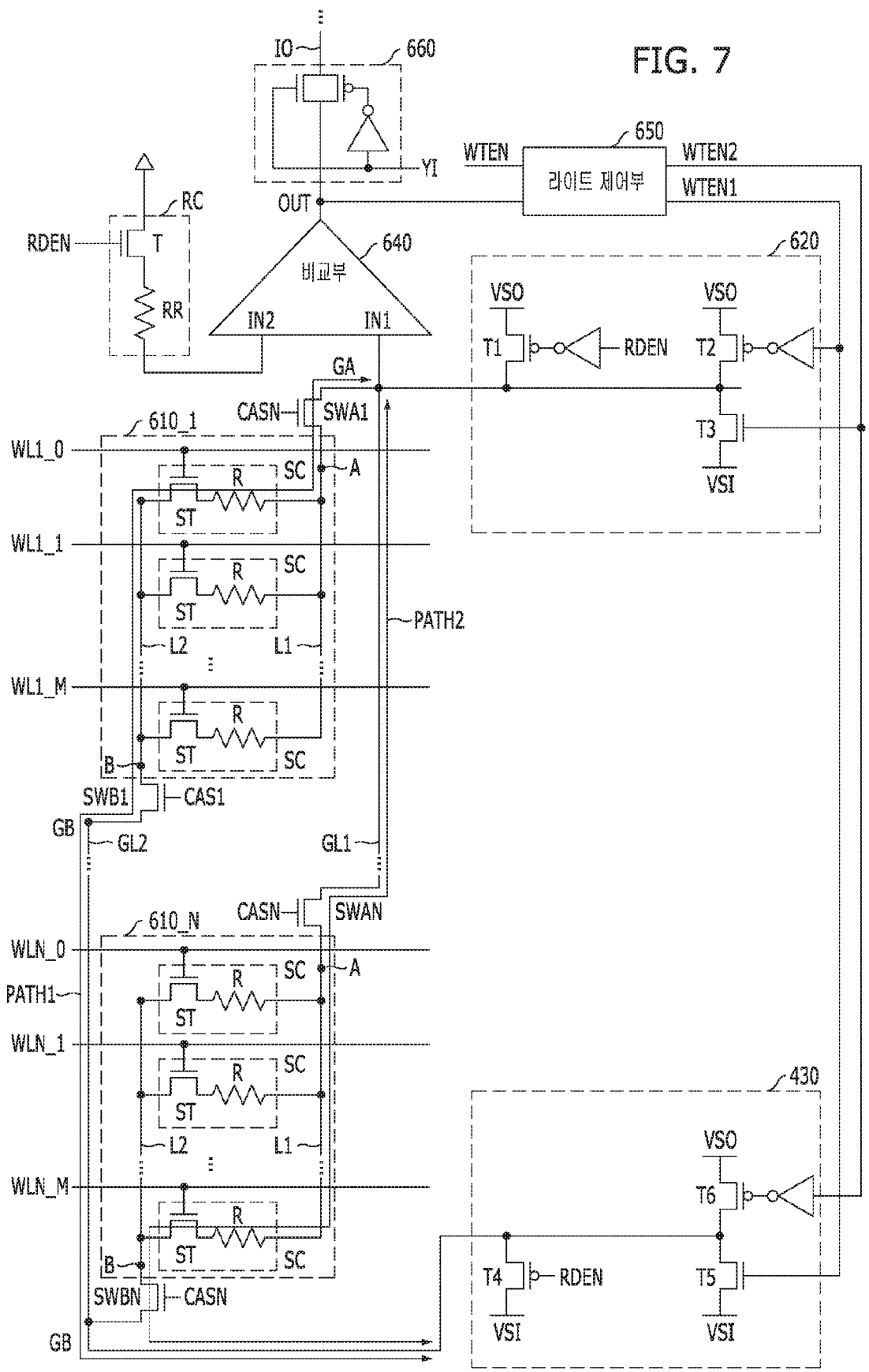
FIG. 7 is a diagram explaining the effects of the memory circuit (device) shown in FIG. 6.

FIG. 7 is a diagram explaining the effects of the semiconductor device shown in FIG. 6.

In FIG. 7, effects of the semiconductor device shown in FIG. 6 will be described below by exemplifying the case of reading or writing data from or to the storage cell SC corresponding to the word line WL1_0 among the plurality of storage cells SC of the first cell array 610_1 and the case of reading or writing data from or to the storage cell SC corresponding to the word line WLN_M among the plurality of storage cells SC of the $N^{th}$ cell array 610_N.

First, in the case of reading or writing data from or to the storage cell SC corresponding to the word line WL1_0, the current caused by the first driver 620 and the second driver 630 flows along a first path PATH1 which includes the one end GA of the first global line GL1, the one end A of the first line L1 of the first cell array 610_1, the storage cell SC corresponding to the word line WL1_0, the one end B of the second line L2 of the first cell array 610_1 and the one end GB of the second global line GL2.

Next, in the case of reading or writing data from or to the storage cell SC corresponding to the word line WLN_M, the current caused by the first driver 620 and the second driver 630 flows along a second path PATH2 which includes the one end GA of the first global line GL1, the one end A of the first line L1 of the $N^{th}$ cell array 610_N, the storage cell SC corresponding to the word line WLN_M, the one end B of the second line L2 of the $N^{th}$ cell array 610_N and the one end GB of the second global line GL2.

By comparing the first path PATH1 and the second path PATH2, it can be seen that the lengths of the two paths PATH1 and PATH2 are substantially the same. Therefore, paths through which current flowing to read or write data from or to selected storage cells SC passes are the same regardless of the positions of the selected storage cells SC. This is because the first driver 620 and the second driver 630 are disposed opposite to each other when viewed from the first to $N^{th}$ cell arrays 610_1 to 610_N and one side switches and other side switches corresponding to the respective cell arrays are disposed opposite to each other. That is to say, the first driver 620 is disposed at the upper end of the first cell array 610_1 and the second driver 630 is disposed at the lower end of the $N^{th}$ cell array 610_N which is opposite to the upper end of the first cell array 610_1, and one side switch of each cell array is disposed at the upper end of its corresponding cell array and the other side switch of each cell array is disposed at the lower end of its corresponding cell array. Therefore, parasitic components (for example, the parasitic capacitance of the global lines GL1 and GL2 and the lines L1 and L2 connected to the respective cell arrays) which exert influences on the magnitudes of the current flowing to read or write data from or to the selected storage cells SC are the same regardless of the positions of the selected storage cells SC.

If the influences exerted by parasitic components become the same for all the storage cells SC, since the amounts of the current flowing through selected storage cells SC in the write operation become the same regardless of the positions of the selected storage cells SC, it is possible to precisely write data regardless of the positions of the selected storage cells SC. Further, because a difference in the amounts of current flowing through the selected storage cells SC in the read operation is changed not by parasitic components but only according to the values of the data stored in the selected storage cells SC, it is possible to precisely read data regardless of the positions of the selected storage cells SC.

Therefore, the semiconductor device 600 in FIG. 6 includes first to $N^{th}$ cell arrays 610_1 to 610_N each of which includes a plurality of storage cells SC, a first line L1 connected to one ends of the plurality of storage cells SC and a second line L2 connected to the other ends of the plurality of storage cells SC, a first global line GL1 which is electrically connected with one end A of the first line L1 of a cell array selected among the first to $N^{th}$ cell arrays 610_1 to 610_N, and a second global line GL2 which is electrically connected with one end B of the second line L2 of the selected cell array, wherein, in a read/write operation, the current flows between one end GA of the first global line GL1 corresponding to one side direction D1 of the first cell array 610_1 and one end GB of the second global line GL2 corresponding to the other side direction D2 of the $N^{th}$ cell array 610_N.

The semiconductor device 600 further includes first to $N^{th}$ one side switches SWA1 to SWAN which are connected between one ends A of first lines L1 of the first to $N^{th}$ cell arrays 610_1 to 610_N and the first global line GL1 and are turned on when cell arrays connected to them are selected among the first to $N^{th}$ cell arrays 610_1 to 610_N, and first to $N^{th}$ other side switches SWB1 to SWBN which are connected between one ends B of second lines L2 of the first to $N^{th}$ cell arrays 610_1 to 610_N and the second global line GL2 and are turned on when cell arrays connected to them are selected among the first to $N^{th}$ cell arrays 610_1 to 610_N.

The semiconductor device 600 operates such that the current flows between the one end GA of the first global line GL1 and the one end GB of the second global line GL2 in the read or write operation, and the current flows through a selected storage cell SC. Influences exerted on the amounts of current flowing through selected storage cells SC by the parasitic components of the global lines GL1 and GL2 and the lines L1 and L2 are proportional to the lengths of paths through which the current to pass through the selected storage cells SC flows. In this regard, since paths through which current to pass through the selected storage cells SC flows have the same length, the influences exerted on the amounts of the current flowing through the selected storage cells SC by the parasitic components of the global lines GL1 and GL2 and the lines L1 and L2 are the same regardless of the positions of the selected storage cells SC.

The above and other memory circuits or semiconductor devices based on the disclosed technology can be used in a range of devices or systems. FIGS. 8-12 provide some examples of devices or systems that can implement the memory circuits disclosed herein.

Figure 8:
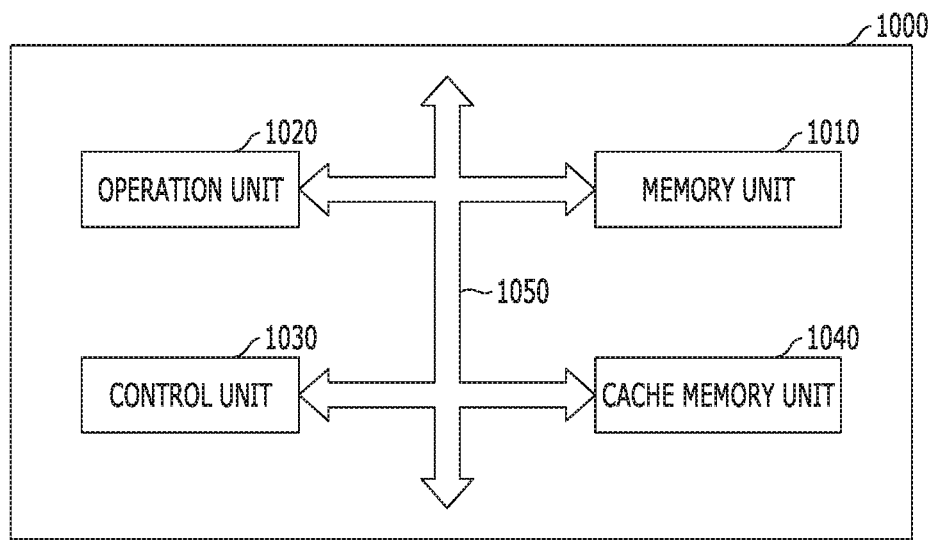
FIG. 8 shows an example of a configuration diagram of a microprocessor implementing memory circuitry based on the disclosed technology.

FIG. 8 shows an example of a configuration diagram of a microprocessor based on another implementation of the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and an address where data for performing of the operations are stored.

The memory unit 1010 may include one or more of the above-described semiconductor devices in accordance with the implementations. For example, the memory unit 1010 implementation may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line. Through this, a operating precision of the memory unit 1010 may be improved. Consequently, stability and performance of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands and controlling input and output of signals of the microprocessor, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
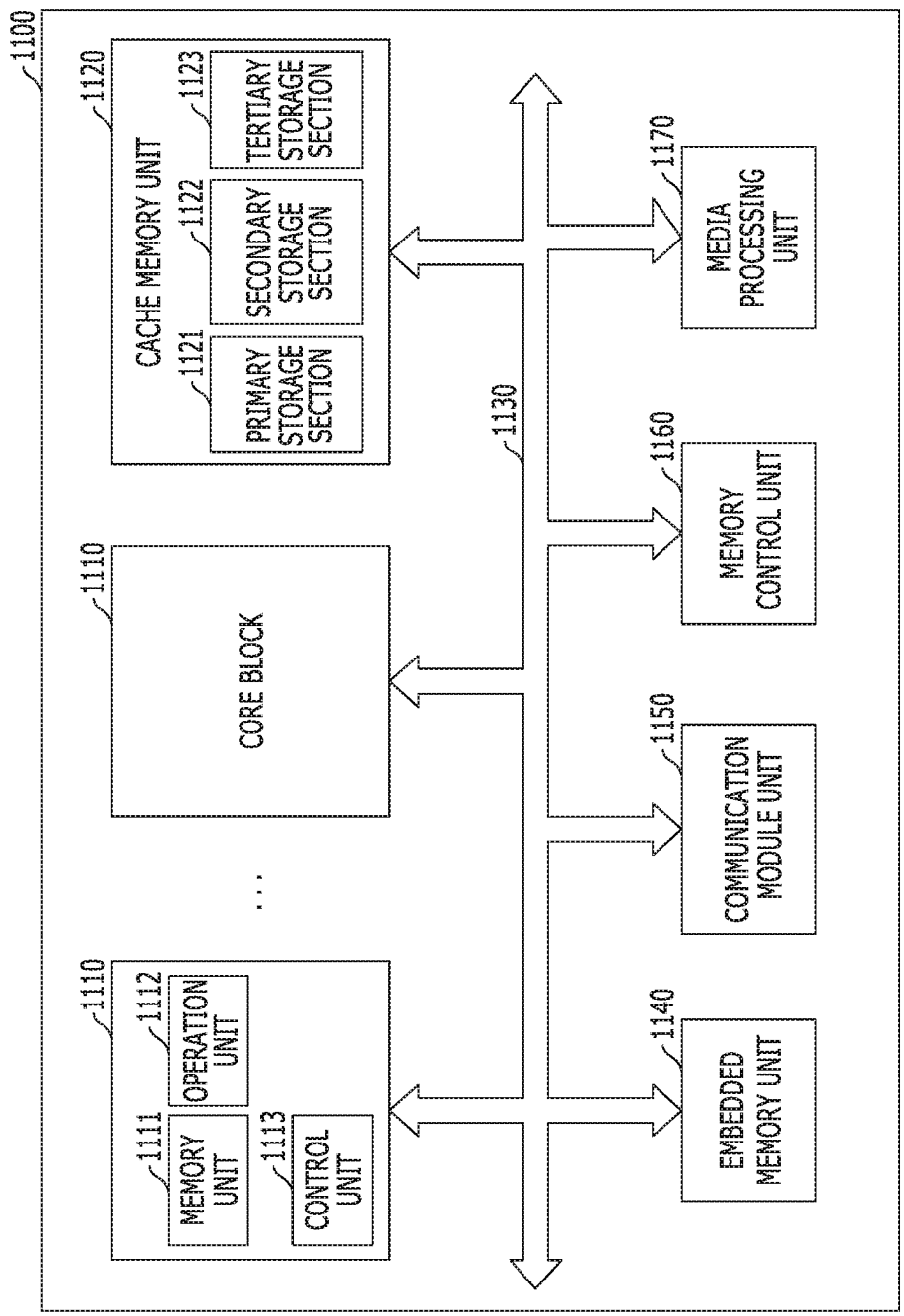
FIG. 9 shows an example of a configuration diagram of a processor implementing memory circuitry based on the disclosed technology.

FIG. 9 is a configuration diagram of a processor based on another implementation of the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and an address where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage unit 1121, a secondary storage unit 1122 and a tertiary storage unit 1123. In general, the cache memory unit 1120 includes the primary and secondary storage units 1121 and 1122, and may include the tertiary storage unit 1123 in the case where high storage capacity is required. As the occasion demands, the cache memory unit 1120 may include an increased number of storage units. That is to say, the number of storage units which are included in the cache memory unit 1120 may be changed according to a design. The speeds at which the primary, secondary and tertiary storage units 1121, 1122 and 1123 store and discriminate data may be the same or different. In the case where the speeds of the respective storage units 1121, 1122 and 1123 are different, the speed of the primary storage unit 1121 may be largest. At least one storage unit of the primary storage unit 1121, the secondary storage unit 1122 and the tertiary storage unit 1123 of the cache memory unit 1120 may include one or more of the above-described semiconductor devices in accordance with the implementations. For example, the cache memory unit 1120 implementation may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line. Through this, a operating precision of cache memory unit 1120 may be improved. Consequently, stability and performance of the processor 1100 may be improved.

Although it was shown in FIG. 9 that all the primary, secondary and tertiary storage units 1121, 1122 and 1123 are configured inside the cache memory unit 1120, it is to be noted that all the primary, secondary and tertiary storage units 1121, 1122 and 1123 of the cache memory unit 1120 may be configured outside the core unit 1110 and may compensate for a difference in data processing speed between the core unit 1110 and the external device. Meanwhile, it is to be noted that the primary storage unit 1121 of the cache memory unit 1120 may be disposed inside the core unit 1110 and the secondary storage unit 1122 and the tertiary storage unit 1123 may be configured outside the core unit 1110 to strengthen the function of compensating for a difference in data processing speed. In another implementation, the primary and secondary storage units 1121, 1122 may be disposed inside the core units 1110 and tertiary storage units 1123 may be disposed outside core units 1110. The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage unit 1121 of the cache memory unit 1120 may be configured in each core unit 1110 in correspondence to the number of the plurality of core units 1110, and the secondary storage unit 1122 and the tertiary storage unit 1123 may be configured outside the plurality of core units 1110 in such a way as to be shared through the bus interface 1130. The processing speed of the primary storage unit 1121 may be larger than the processing speeds of the secondary and tertiary storage unit 1122 and 1123. In another implementation, the primary storage unit 1121 and the secondary storage unit 1122 may be configured in each core unit 1110 in correspondence to the number of the plurality of core units 1110, and the tertiary storage unit 1123 may be configured outside the plurality of core units 1110 in such a way as to be shared through the bus interface 1130. The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data prepared in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory) and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), and a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
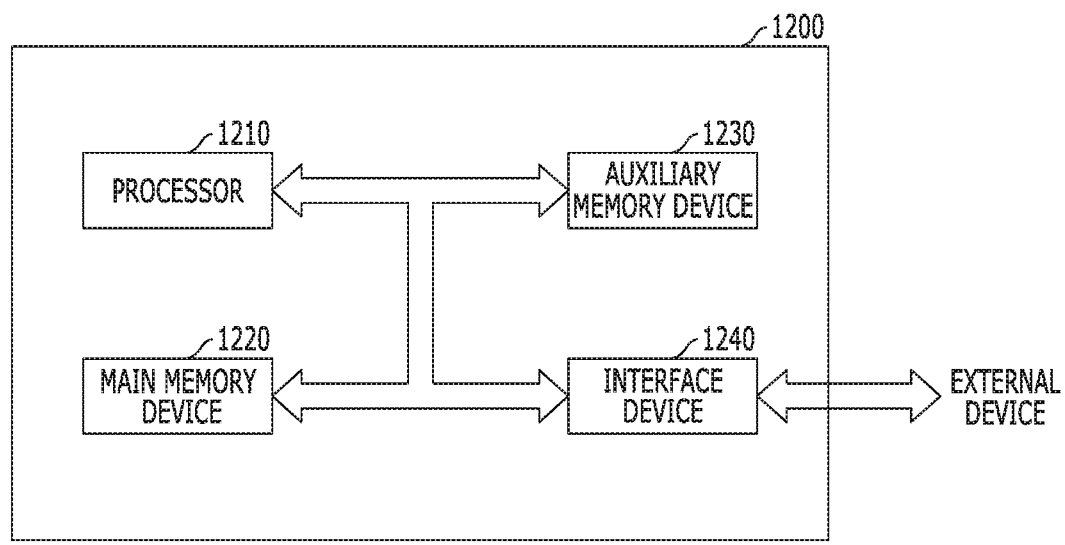
FIG. 10 shows an example of a configuration diagram of a system implementing memory circuitry based on the disclosed technology.

FIG. 10 is a configuration diagram of a system based on another implementation of the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 decodes inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 implementation may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line. Through this, a operating precision of the main memory device 1220 may be improved. Consequently, stability and performance of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 implementation may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line. Through this, a operating precision of the auxiliary memory device 1230 may be improved. Consequently, stability and performance of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device and so on. The communication device may include a module capable of being connected with a wired network, a module capable of being connected with a wireless network and both of them.

The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
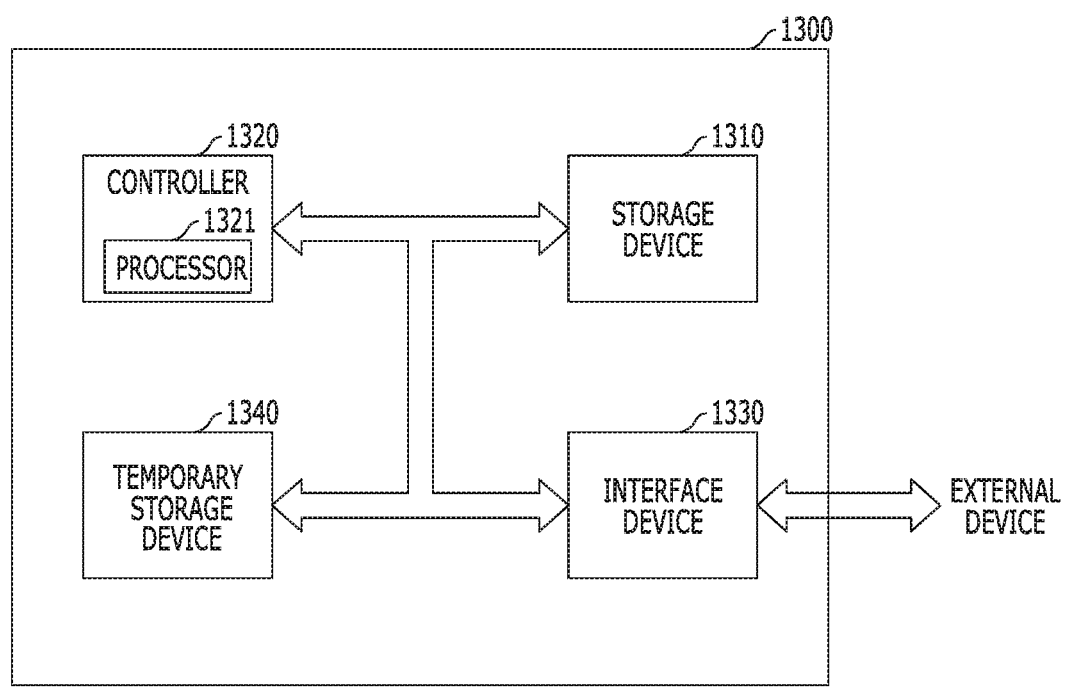
FIG. 11 shows an example of a configuration diagram of a data storage system implementing memory circuitry based on the disclosed technology.

FIG. 11 is a configuration diagram of a data storage system based on another implementation of the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices.

In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other. The temporary storage device 1340 can store data temporarily implementation for efficiently transferring data between the interface 1330 and the storage device 1310 according to diversifications and high performance of an interface with an external device, a controller and a system. For example, the temporary storage device 1340 implementation for temporarily storing data may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line. Through this, a operating precision of the temporary storage device 1340 may be improved. Consequently, stability and performance of the data storage system 1300 may be improved.

Figure 12:
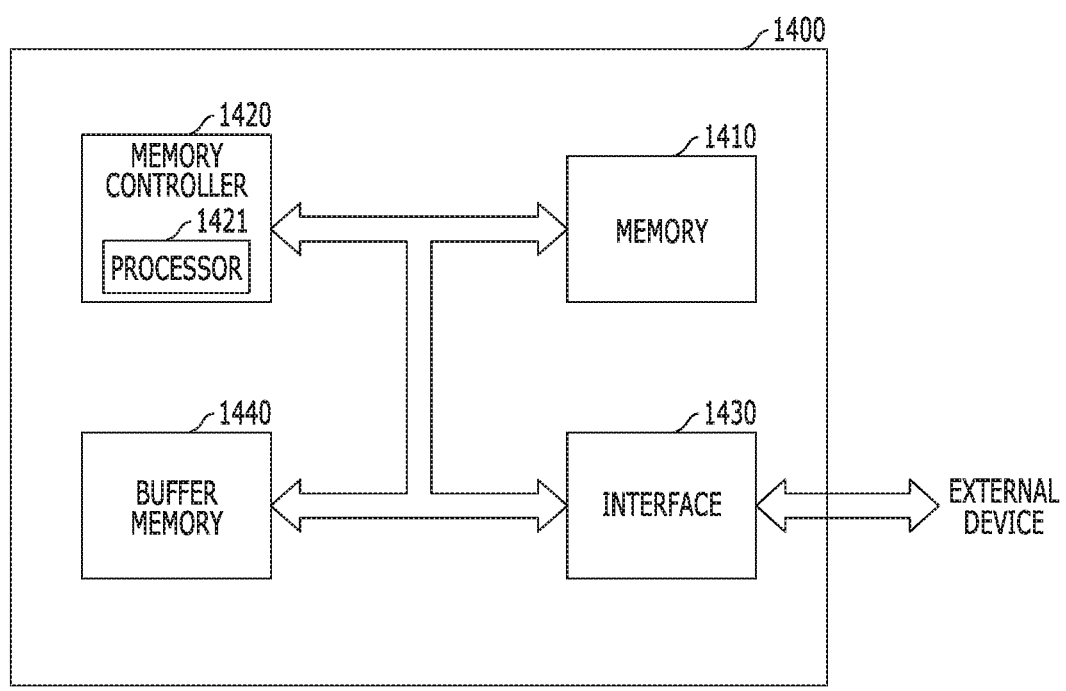
FIG. 12 shows an example of a configuration diagram of a memory system implementing memory circuitry based on the disclosed technology.

FIG. 12 is a configuration diagram of a memory system based on another implementation of the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 implementation may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line. Through this, a operating precision of the memory 1410 may be improved. Consequently, stability and performance of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 implementation may include a cell array including a plurality of storage cells; a first line connected to one ends of the plurality of storage cells; a second line connected to the other ends of the plurality of storage cells; a first driver connected to one end of the first line at a first contact location on one side of the cell array, and configured to apply a first electrical signal to the one end of the first line; and a second driver connected to one end of the second line at a second contact location on a side of the cell array opposing the side of the cell array where the first contact location is located, and configured to apply a second electrical signal to the one end of the second line. Through this, a operating precision of the buffer memory 1440 may be improved. Consequently, stability and performance of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 11-15 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated.

What is claimed is:

1. A electronic device comprising:
   a first to Nth cell arrays each including a plurality of storage cells, a first line which is connected to one ends of the plurality of storage cells, and a second line which is connected to the other ends of the plurality of storage cells;
   a first global line electrically connected with one end of the first line of a cell array selected among the first to Nth cell arrays; and
   a second global line electrically connected with one end of the second line of the selected cell array,
   wherein, the first and second global lines are configured to, in a read/write operation, cause a current to flow between one end of the first global line corresponding to one side direction of the first cell array and one end of the second global line corresponding to the other side direction of the Nth cell array.

2. The electronic device according to claim 1, wherein, in the read/write operation, current which flows between the one end of the first global line and the one end of the second global line flows through a storage cell selected among the plurality of storage cells of a cell array selected among the first to Nth cell arrays.

3. The electronic device according to claim 2, wherein one end of the first line of a Kth ($1 \leq K \leq N$) cell array among the first to Nth cell arrays is the one side direction of the Kth cell array, and one end of the second line of the Kth cell array is the other side direction of the Kth cell array.

4. The electronic device according to claim 3, wherein in the read/write operation, current which flows between the one end of the first global line and the one end of the second global line flows between the one end of the first line and the one end of the second line of a cell array selected among the first to Nth cell arrays.

5. The electronic device according to claim 3, further comprising:
   first to Nth one side switches connected between one ends of first lines of the first to Nth cell arrays and the first global line, and configured to be turned on when cell arrays connected to them are selected among the first to Nth cell arrays; and
   first to Nth other side switches connected between one ends of second lines of the first to Nth cell arrays and the second global line, and configured to be turned on when cell arrays connected to them are selected among the first to Nth cell arrays.

6. An electronic device comprising:
   a memory circuit including:
      an array of memory cells each having a resistance variable element exhibiting two different resistance values in response to two different currents flowing therethrough in opposite directions, respectively, and a cell select transistor responsive to a cell select control signal to activate the memory cell;

a first line coupled to a first side of the memory cells;

a first driver circuit coupled to the first line to supply a first electrical control signal;

a second line coupled to a second side of the memory cells; and a second driver circuit coupled to the second line to supply a second electrical control signal; and a memory control circuit coupled to the array of memory cells to apply a cell select control signal to activate a select memory cell, wherein a coupling between the first driver circuit and the first line and a coupling between the second driver circuit and the second line are configured to cause current path lengths for currents flowing through different select memory cells of the array of the memory cells between the first and second drivers to be a constant.

7. The electronic device according to claim 6, wherein the memory control circuit includes a comparator that is coupled to the first line and a reference cell that is coupled to the comparator, wherein the comparator compares currents from the first line and the reference cell to generate an output indicating a memory value of the select memory cell.

8. The electronic device according to claim 6, comprising a microprocessor comprising:

a control unit configured to receive a signal including a command from an outside, and control extraction, decoding, input or output of the command;

an operation unit configured to perform an operation according to a result that the control unit decodes the command; and a memory unit configured to store at least one of data for performing the operation, data corresponding to a result of performing the operation, or an address of data for which the operation is performed, wherein the memory circuit is part of the memory unit of the microprocessor.

9. The electronic device according to claim 6, further comprising a processor comprising:

a core block configured to perform, according to a command inputted from an outside, an operation corresponding to the command, by using data;

a cache memory unit configured to store at least one of data for performing the operation, data corresponding to a result of performing the operation, or an address of data for which the operation is performed; and a bus interface connected between the core block and the cache memory unit, and configured to transmit data between the core block and the cache memory unit, wherein the memory circuit is part of the cache memory unit of the processor.

10. The electronic device according to claim 6, further comprising a system comprising:

a processor configured to decode a command inputted from an outside and control an operation for information according to a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the memory circuit is part of the auxiliary memory device or the main memory device.

11. The electronic device according to claim 6, further comprising a data storage system comprising:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the memory circuit is part of the storage device or the temporary storage device.

12. The electronic device according to claim 6, further comprising a memory system comprising:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the memory circuit is part of the memory or the buffer memory.

13. The electronic device according to claim 6, wherein the first electrical control signal and the second electrical control signal are voltage signals.

14. The electronic device according to claim 6, wherein a direction of a current which flows through the one end of the first line, a selected memory cell and the one end of the second line, is determined according to each level of the first and second electrical control signals.

15. The electronic device according to claim 6, wherein the variable resistance element includes metal oxide including a transition metal oxide.

16. The electronic device according to claim 6, wherein the variable resistance element includes a phase change material.

17. The electronic device according to claim 6, wherein the variable resistance element includes a structure having a tunnel barrier layer interposed between two magnetic layers.

18. The electronic device according to claim 6, wherein the first side and the second side are opposite sides of a selected memory cell.

19. The electronic device according to claim 6, wherein the first electrical control signal and the second electrical control signal have levels determined according to a value of data to be written in a selected memory cell.

20. The electronic device according to claim 6, wherein the first electrical control signal and the second electrical control signal have levels different from each other.

* * * * *